US012635350B2

(12) United States Patent
Bai et al.

(10) Patent No.: US 12,635,350 B2
(45) Date of Patent: May 19, 2026

(54) DISPLAY PANELS

(71) Applicant: Wuhan China Star Optoelectronics Semiconductor Display Technology Co., Ltd., Wuhan (CN)

(72) Inventors: Dan Bai, Wuhan (CN); Yu Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 409 days.

(21) Appl. No.: 18/275,028

(22) PCT Filed: May 12, 2023

(86) PCT No.: PCT/CN2023/094045
§ 371 (c)(1),
(2) Date: Jul. 31, 2023

(87) PCT Pub. No.: WO2024/216688
PCT Pub. Date: Oct. 24, 2024

(65) Prior Publication Data
US 2025/0008775 A1 Jan. 2, 2025

(30) Foreign Application Priority Data

Apr. 19, 2023 (CN) .......................... 202310426597.5

(51) Int. Cl.
| *H10K 59/122* | (2023.01) |
| *H10K 59/80* | (2023.01) |
| *H10K 102/00* | (2023.01) |

(52) U.S. Cl.
CPC ....... *H10K 59/122* (2023.02); *H10K 59/8051* (2023.02); *H10K 59/80517* (2023.02); *H10K 2102/351* (2023.02)

(58) Field of Classification Search
CPC ............. H10K 59/122; H10K 59/8021; H10K 59/80517; H10K 59/80515;
(Continued)

(56) References Cited

U.S. PATENT DOCUMENTS

| 9,059,424 B2 | 6/2015 | Ko et al. |
| 10,749,143 B2 | 8/2020 | Lin et al. |
(Continued)

FOREIGN PATENT DOCUMENTS

| CN | 106098954 | 11/2016 |
| CN | 108400154 | 8/2018 |
(Continued)

OTHER PUBLICATIONS

International Search Report and the Written Opinion Dated Dec. 29, 2023 From the International Searching Authority Re. Application No. PCT/CN2023/094045 and Its Translation Into English. (13 Pages).
(Continued)

*Primary Examiner* — Anne M Hines
*Assistant Examiner* — Jose M Diaz

(57) ABSTRACT

Display panels are provided according to embodiments of the present disclosure. The display panel includes a substrate, anodes disposed on the substrate, and a pixel definition layer. The anodes include at least one first sub-anode and at least one second sub-anode adjacent to first sub-anode. A difference between a first distance between a side of the first sub-anode away from the substrate and the substrate and a second distance between a side of the second sub-anode away from the substrate and the substrate is greater than or equal to a thickness of the second sub-anode.

20 Claims, 9 Drawing Sheets

(58) Field of Classification Search
CPC ............. H10K 59/80521; H10K 59/35; H10K 2102/351; H10K 77/10
See application file for complete search history.

(56) References Cited

U.S. PATENT DOCUMENTS

| | | | |
|---|---|---|---|
| 2018/0301521 A1 | 10/2018 | Yang | |
| 2020/0357854 A1* | 11/2020 | Koshihara ............. | H10K 59/30 |

FOREIGN PATENT DOCUMENTS

| | | |
|---|---|---|
| CN | 114122086 | 3/2022 |
| KR | 10-2011-0060474 | 6/2011 |

OTHER PUBLICATIONS

Notice of Submission of Opinion Dated Dec. 18, 2024 From the Korean Intellectual Property Office Re. Application No. 10-2023-7041298 and Its Translation Into English. (13 Pages).

* cited by examiner

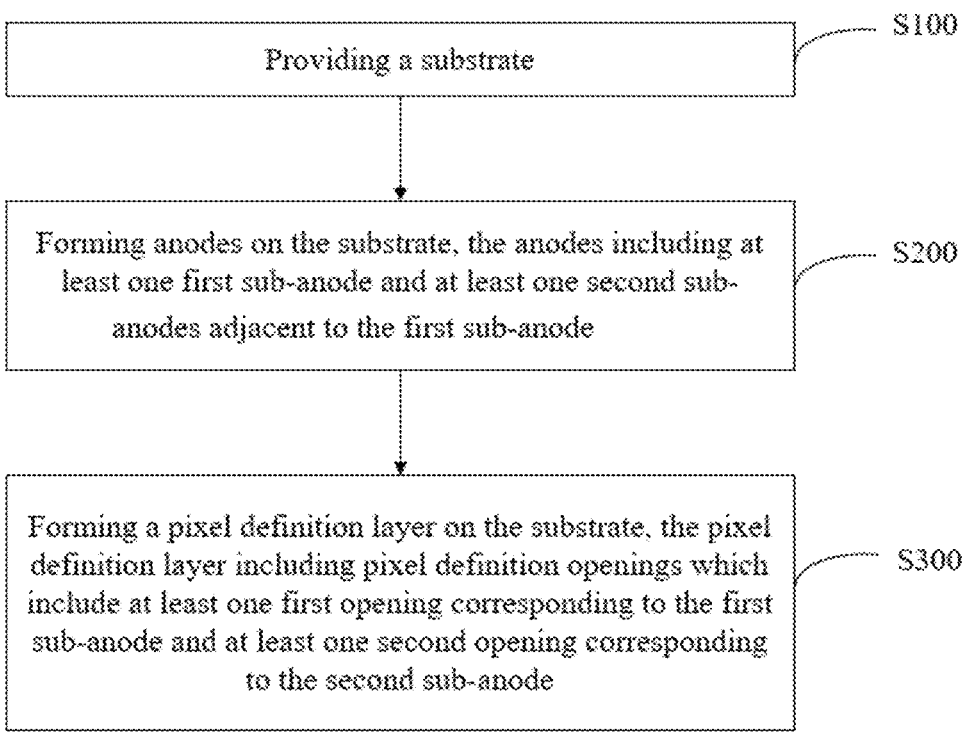

| | |
|---|---|
| Providing a substrate | S100 |
| Forming anodes on the substrate, the anodes including at least one first sub-anode and at least one second sub-anodes adjacent to the first sub-anode | S200 |
| Forming a pixel definition layer on the substrate, the pixel definition layer including pixel definition openings which include at least one first opening corresponding to the first sub-anode and at least one second opening corresponding to the second sub-anode | S300 |

FIG. 7

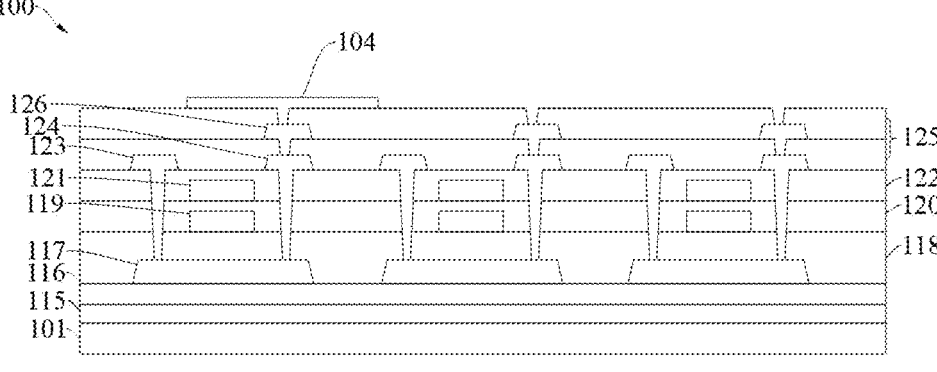

FIG. 8A

DISPLAY PANELS

RELATED APPLICATIONS

This application is a National Phase of PCT Patent Application No. PCT/CN2023/094045 having International filing date of May 12, 2023, which claims the benefit of priority of China Patent Application No. 202310426597.5 filed on Apr. 19, 2023. The contents of the above applications are all incorporated by reference as if fully set forth herein in their entirety.

TECHNICAL FIELD

The present disclosure relates to the field of display technologies, and in particular, to display panels.

BACKGROUND

At present, as demand for the resolution of display products increases, the market demand for high-resolution organic light-emitting diode (OLED) display panels is increasing. However, in the existing OLED display panel, anodes are formed by wet etching, a degree of a side etching is difficult to control, and a distance between the anodes cannot be reduced, making it difficult to improve the resolution of the display panel.

Therefore, there is an urgent need for display panels to solve the above technical problems.

SUMMARY OF THE INVENTION

The present disclosure provides display panels, which can alleviate the technical problems that the distance between the anodes of the existing display panel is difficult to reduce, resulting in difficulty in improving the resolution of the display panel.

In order to solve the above technical problems, technical solutions according to the present disclosure are provided as follows.

The present disclosure provides a display panel, including:

a substrate; and anodes, disposed on the substrate and including at least one first sub-anode and at least one second sub-anode adjacent to the first sub-anode;

herein, there is a first distance between a side of the first sub-anode away from the substrate, and the substrate and there is a second distance between a side of the second sub-anode away from the substrate and the substrate; and a difference between the second distance and the first distance is greater than or equal to a thickness of the second sub-anode.

Preferably, the display panel further includes a pixel definition layer disposed on a side of the first sub-anode away from the substrate, at least a part of the pixel definition layer is disposed on a side of the second sub-anode adjacent to the substrate.

Preferably, the pixel definition layer includes a first pixel definition sublayer disposed on the side of the second sub-anode adjacent to the substrate and a second pixel definition sublayer disposed on a side of the first pixel definition sublayer away from the substrate.

Preferably, the pixel definition layer further includes pixel definition openings, and the pixel definition openings include a first opening corresponding to the first sub-anode and a second opening corresponding to the second sub-anode;

the first opening exposes at least a part of the first sub-anode, and the second opening exposes at least a part of the second sub-anode; and a depth of the first opening is greater than a depth of the second opening.

Preferably, the first opening penetrates through the first pixel definition sublayer and the second pixel definition sublayer, and the second opening penetrates through the second pixel definition sublayer.

Preferably, the anodes further include at least one third sub-anode disposed adjacent to the first sub-anode and/or the second sub-anode, the pixel definition openings further include a third opening corresponding to the third sub-anode, the third opening exposes at least a part of the third sub-anode; and a depth of the third opening is less than or equal to the depth of the first opening.

Preferably, the second opening only penetrates through the second pixel definition sublayer, and the third opening only penetrates through the second pixel definition sublayer.

Preferably, the pixel definition layer further includes a third pixel definition sublayer disposed on a side of the second pixel definition sublayer away from the substrate;

the third opening only penetrates through the third pixel definition sublayer, the first opening penetrates through the first pixel definition sublayer, the second pixel definition sublayer, and the third pixel definition sublayer, and the second opening only penetrates through the second pixel definition sublayer and the third pixel definition sublayer.

Preferably, the display panel further includes a blue light-emitting layer, a green light-emitting layer, and a red light-emitting layer;

herein, the blue light-emitting layer is disposed in the first opening, the green light-emitting layer is disposed in the second opening, and the red light-emitting layer is disposed in the third opening; and a thickness of the first sub-anode, a thickness of the second sub-anode, and a thickness of the third sub-anode increase sequentially.

Preferably, the anodes include first anode subparts and one or more second anode subparts, the first sub-anode is composed of one of the first anode subparts, the second sub-anode is composed of one of the first anode subparts, and the third sub-anode is composed of one of the first anode subparts and one of the second anode subparts; and a thickness of each of the first anode subparts corresponding to the first sub-anode is less than a thickness of each of the first anode subparts corresponding to the second sub-anode.

Preferably, the anodes include first anode subparts, each of the first sub-anode, the second sub-anode, and the third sub-anode is composed of one of the first anode subparts; and a thickness of each of the first anode subparts corresponding to the first sub-anode, a thickness of each of the first anode subparts corresponding to the second sub-anode, and a thickness of each of the first anode subparts corresponding to the third sub-anode increase sequentially.

Preferably, the pixel definition layer further includes pixel definition parts each surrounding one of the pixel definition openings, and a width of an orthographic projection of each of the pixel definition parts on the substrate is less than or equal to 2.5 microns; and a distance between orthographic projections of adjacent ones of the anodes on the substrate is greater than or equal to 1 micron.

Preferably, the first pixel definition sublayer includes a first inorganic sublayer and a second inorganic sublayer disposed on a side of the first inorganic sublayer away from the substrate, the pixel definition opening includes a first sub-opening penetrating through the first inorganic sublayer and a second sub-opening penetrating through the second inorganic sublayer, and an orthographic projection of the second sub-opening on the substrate is located within an orthographic projection of the first sub-opening on the substrate.

Preferably, the first pixel definition sublayer further includes a fifth inorganic sublayer disposed on a side of the first inorganic sublayer adjacent to the substrate, the pixel definition openings include a fifth sub-opening penetrating through the fifth inorganic sublayer, and an orthographic projection of the fifth sub-opening on the substrate is located within the orthographic projection of the first sub-opening on the substrate.

Preferably, the second pixel definition sublayer includes a third inorganic sublayer and a fourth inorganic sublayer disposed on a side of the third inorganic sublayer away from the substrate, each of the pixel definition openings includes a third sub-opening penetrating through the third inorganic sublayer and a fourth sub-opening penetrating through the fourth inorganic sublayer, and an orthographic projection of the fourth sub-opening on the substrate is located within an orthographic projection of the third sub-opening on the substrate.

Preferably, the second pixel definition sublayer further includes a sixth inorganic sublayer disposed on a side of the third inorganic sublayer adjacent to the substrate, each of the pixel definition openings includes a sixth sub-opening penetrating through the sixth inorganic sublayer, and an orthographic projection of the sixth sub-opening on the substrate is located within the orthographic projection of the third sub-opening on the substrate.

Preferably, a material of the first inorganic sublayer is selected from silicon nitride compounds; and materials of the second inorganic sublayer and the fifth inorganic sublayer are selected from silicon oxide compounds.

Preferably, a material of the third inorganic sublayer is selected from silicon nitride compounds; and materials of the fourth inorganic sublayer and the sixth inorganic sublayer are selected from silicon oxide compounds.

Preferably, the pixel definition layer further includes fourth openings each disposed between adjacent ones of the pixel definition openings, and each of the fourth openings penetrates at least part of the pixel definition layer.

Preferably, the display panel further includes a barrier layer disposed on the pixel definition layer, and the barrier layer includes fifth openings each corresponding to one of the pixel definition opening.

BENEFICIAL EFFECTS

In the present disclosure, by making the first sub-anode and the second sub-anode stagger along a direction away from the substrate, it is beneficial to improve respective formation precisions of the first sub-anode and the second sub-anode, thereby reducing a distance between an orthographic projection of the first sub-anode on the substrate and an orthographic projection of the second sub-anode on the substrate, which improves the resolution of the display panel.

DESCRIPTION OF DRAWINGS

FIG. 7 is a flow chart of steps of a manufacturing method of a display panel according to an embodiment of the present disclosure;

FIG. 8A to FIG. 8J are schematic views showing a first flow chart of a manufacturing method of a display panel according to an embodiment of the present disclosure.

EMBODIMENTS OF THE INVENTION

Figure 1:
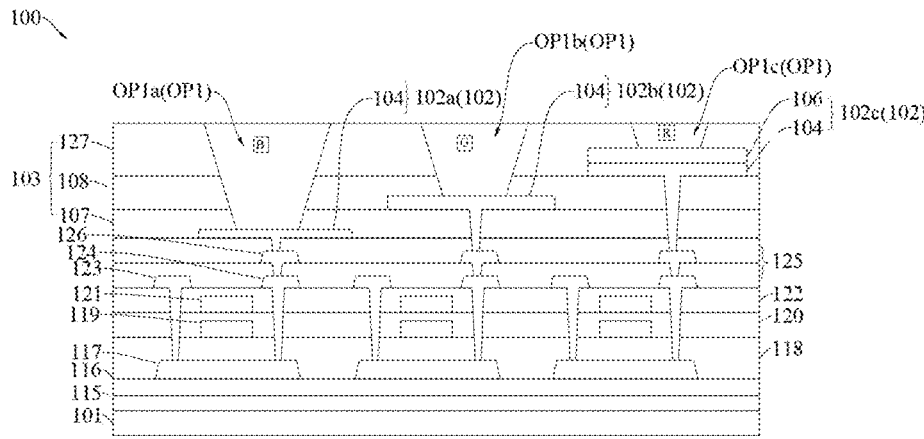
FIG. 1 is a schematic view of a first structure of a display panel according to an embodiment of the present disclosure.

The present disclosure provides display panels. In order to make the purposes, technical solutions, and effect of the present disclosure clearer, the present disclosure will be further described in detail below with reference to the accompanying drawings and examples. It should be understood that the specific embodiments described here are only used to explain the present disclosure, not to limit the present disclosure.

At present, the existing display panel has the problem that it is difficult to improve the resolution of the display panel due to the difficulty in reducing the distance between the anodes.

Referring to FIG. 1 to FIG. 6, embodiments of the present disclosure provides a display panel 100, including:

a substrate 101; and anodes 102, disposed on the substrate 101, including at least one first sub-anode 102a and at least one second sub-anode 102b adjacent to the first sub-anode 102a;

herein, there is a first distance between a side of the first sub-anode 102a away from the substrate and the substrate 101, and there is a second distance between a side of the second sub-anode 102b away from the substrate 101 and the substrate 101; and a difference between the second distance and the first distance is greater than or equal to a thickness of the second sub-anode 102b.

In the present disclosure, the distance between the side of the first sub-anode 102a away from the substrate 101 and the substrate 101 and the distance between the side of the second sub-anode 102b away from the substrate 101 and the substrate 101 are different, so that the first sub-anode 102a and the second sub-anode 102b are stagger along a direction away from the substrate 101. That the first sub-anode 102a and the second sub-anode 102b are respectively formed at different distances from the substrate 101 is beneficial to improve respective formation precisions of the first sub-anode 102a and the second sub-anode 102b, thereby reducing a distance between an orthographic projection of the first sub-anode 102a on the substrate 101 and an orthographic projection of the second sub-anode 102b on the substrate 101, which improves the resolution of the display panel 100.

The technical solutions of the present disclosure will now be described in conjunction with specific embodiments.

Referring to FIG. 1, FIG. 3, FIG. 5, and FIG. 6, in this embodiment, the display panel 100 includes the following structures: a substrate 101, a first barrier layer 115, a buffer layer 116, a thin film transistor layer, a planarization layer 125, an auxiliary metal layer 126, anodes 102, a pixel definition layer 103, organic layers, a cathode, and a package layer.

The substrate 101 may be made of an organic material that has insulation properties, is flexible, and is capable of being heat-treated at a temperature equal to or greater than about 450° C. The substrate 101 may be formed, for example, as a single layer made of polyimide or may be formed as a multi-layer repeatedly stacked by coating and curing polyimide. The substrate 101 may be a flexible substrate formed by coating a polymer material such as polyimide on a support base (not shown) and curing the polymer material. In this case, the substrate 101 may be formed in a multi-layer by repeatedly coating and curing the polymer material. The support base may be made of glass, metal, or ceramics. The polyimide can be coated on the support base by coating processes such as spin coating, slit coating, ink-jet coating, etc. The support base may be removed in subsequent processes.

In some embodiments, the substrate 101 includes a first flexible substrate, an intermediate layer, an adhesive layer, and a second flexible substrate. The first flexible substrate and the second flexible substrate may be made of the same material such as polyimide. The intermediate layer may be made of, for example, an inorganic material including at least one of SiOx and SiNx. The adhesive layer may be made of hydrogenated amorphous silicon (a-Si:H).

The first barrier layer 115 is formed on the substrate 101. The first barrier layer 112 may include various insulation materials (for example, silicon oxide or silicon nitride), and may be a single-layer or multi-layer structure, which is not limited here. The barrier layer provides a planarization layer on an upper surface of the substrate and can block or prevent impurities and moisture from penetrating into light-emitting layers from the substrate 101.

In some embodiments, the first barrier layer 115 may include a first barrier sublayer and a second barrier sublayer formed on the first barrier sublayer. For example, the first barrier sublayer may be formed between the second barrier sublayer and the substrate 10. In practical applications, the first barrier sublayer may be formed by depositing silicon oxide, and subsequently, the second barrier sublayer is formed by depositing silicon nitride through an in-situ process. In this case, the first barrier sublayer can be formed of SiOx or SiON (which can enhance an interfacial bonding performance between the barrier layer and the substrate 101), and the first barrier sublayer can be formed to have a thickness of about 100 nm to about 600 nm. The second barrier sublayer can be formed of SiNx or SiON (which can enhance an interfacial bonding performance between the barrier layer and the buffer layer 116 disposed subsequently), and the second barrier sublayer can be formed to have a thickness of about 50 nm to about 200 nm.

The buffer layer 116 is formed on the first barrier layer 115. The buffer layer 116 may include one or more inorganic insulation layers. The inorganic insulation layer includes materials such as silicon oxide or silicon nitride. The buffer layer 116 provides a planarization layer on the upper surface of the substrate 101 and can block or prevent impurities and moisture from penetrating into the light-emitting layers from the substrate 101.

In some embodiments, the buffer layer 116 includes a first buffer sublayer made of, for example, silicon nitride and a second buffer sublayer made of, for example, silicon oxide. The second buffer sublayer and the first buffer sublayer may be made of silicon nitride having the same film quality (for example, the same density and the same film stress). An oxide film may be provided at an interface between the second buffer sublayer and the first buffer sublayer. The oxide film may be a natural oxide film formed between processes of forming the second barrier sublayer and forming the first buffer sublayer, and may have a thickness of several tens of angstroms or less. In practical applications, a thickness of the first buffer sublayer may be about 50 nm to 100 nm, and a thickness of the second sub buffer layer 24 may be about 100 nm to 300 nm.

The thin film transistor layer includes thin film transistors. The thin film transistor includes a semiconductor 117 formed on the buffer layer 116. The semiconductor 117 may be made of polysilicon. The semiconductor 117 is divided into a channel area, and a source area and a drain area formed on both sides of the channel area. The channel area of the semiconductor 117 is polysilicon without doping impurities, that is, an intrinsic semiconductor. The source area and the drain area are polysilicon doped with conductive impurities, ie, impurity semiconductors. The impurities doped in the source area and the drain area may be any of P-type impurities and N-type impurities.

The thin film transistor layer further includes a first gate insulation layer 118 covering the semiconductor 117. The first gate insulation layer 118 may be formed as a multi-layer or a single layer of at least one of tetraethyl orthosilicate (TEOS), silicon nitride, and silicon oxide.

The thin film transistor further includes a first gate 119 formed on the first gate insulation layer 118. The first gate 119 overlaps with the channel area. The first gate 119 may be formed as a multi-layer or a single layer including a low-resistance material such as Al, Ti, Mo, Cu, Ni, or alloys thereof, or a material having high corrosion resistance.

The thin film transistor layer further includes a second gate insulation layer 120 covering the first gate 119. The second gate insulation layer 120 may be formed as a multi-layer or a single layer of at least one of tetraethyl orthosilicate (TEOS), silicon nitride, and silicon oxide.

The thin film transistor further includes a second gate 121 formed on the second gate insulation layer 120. The second gate 121 overlaps with the first gate 119. The second gate 121 may be formed as a multi-layer or a single layer including a low-resistance material such as Al, Ti, Mo, Cu, Ni, or alloys thereof, or a material having high corrosion resistance.

The thin film transistor layer further includes a first interlayer insulation layer 122 formed on the second gate 121. The first interlayer insulation layer 122 may be formed as a multi-layer or a single layer of at least one of tetraethyl orthosilicate (TEOS), silicon nitride, and silicon oxide. The first interlayer insulation layer 122, the first gate insulation layer 118, and the second gate insulation layer 120 include a source contact hole and a drain contact hole. The source area and the drain area are respectively exposed through the source contact hole and the drain contact hole.

The thin film transistor further includes a source 123 and a drain 124 arranged in a same layer, both of which are formed on the first interlayer insulation layer 122. The source 123 is connected to the source area through the source contact hole, and the drain 124 is connected to the drain area through the drain contact hole. The source 123 and the drain 124 may be formed as a multi-layer or a single layer including a low-resistance material such as Al, Ti, Mo, Cu, Ni, or alloys thereof, or a material having high corrosion resistance. For example, the source 123 and the drain 124 may be a triple layer of Ti/Cu/Ti, Ti/Ag/Ti, Ti/Al/Ti, or Mo/Al/Mo, or other single-layer or multi-layer structures.

The planarization layer 125 is formed on the source 123 and the drain 124. The planarization layer 125 includes a through hole, and the drain 124 is exposed through the through hole. The planarization layer 125 may be formed as a multi-layer or a single layer of at least one of tetraethyl orthosilicate (TEOS), silicon nitride, and silicon oxide, and can be made of organic materials with low dielectric constants (for example, polyimide).

In some embodiments, the planarization layer 125 includes a first planarization sublayer formed on the source 123 and the drain 124 and a second planarization sublayer formed on the first planarization sublayer. The through hole includes a first through hole penetrating through the first planarization sublayer and a second through hole penetrating through the second planarization sublayer.

The auxiliary metal layer 126 is located between the first planarization sublayer and the second planarization sublayer. The auxiliary metal layer 126 is connected to the drain through the first through hole. The second through hole exposes the auxiliary metal layer 126. The auxiliary metal layer 126 may be formed as a multi-layer or a single layer including a low-resistance material such as Al, Ti, Mo, Cu, Ni, or alloys thereof, or a material having high corrosion resistance. For example, the auxiliary metal layer may be a triple layer of Ti/Cu/Ti, Ti/Ag/Ti, Ti/Al/Ti, or Mo/Al/Mo, or other single-layer or multi-layer structures.

Each of the anodes 102 is formed on the planarization layer 125 and is electrically connected to the drain through the through hole.

The pixel definition layer 103 is formed on the planarization layer 125. The pixel definition layer 103 includes pixel definition openings OP1. The pixel definition opening OP1 exposes a part of the anode 102.

Referring to FIG. 1 to FIG. 6, in some embodiments, the anodes 102 includes one or more first sub-anodes 102*a* and one or more second sub-anodes 102*b*, and the first sub-anode 102*a* and the second sub-anode 102*b* are adjacent to each other. The pixel definition layer 103 is disposed on a side of the first sub-anode 102*a* away from the substrate 101, and at least a part of the pixel definition layer 103 is disposed on a side of the second sub-anode 102*b* adjacent to the substrate 101.

In some embodiments, the pixel definition layer 103 includes a first pixel definition sublayer 107 and a second pixel definition sublayer 108. The first pixel definition sublayer 107 is disposed on a side of the second sub-anode 102*b* adjacent to the substrate 101, and the second pixel definition sublayer 108 is disposed on a side of the first pixel definition sublayer 107 away from the substrate 101.

In some embodiments, the pixel definition openings OP1 include one or more first openings OP1*a* and one or more second openings OP1*b*. The first opening OP1*a* corresponds to the first sub-anode 102*a*, and the second opening OP1*b* corresponds to the second sub-anode 102*b*. The first opening OP1*a* exposes at least a part of the first sub-anode 102*a*, and the second opening OP1*b* exposes at least a part of the second sub-anode 102*b*.

A depth of the first opening OP1*a* is greater than a depth of the second opening OP1*b*, that is, the distance between the side of the first sub-anode 102*a* away from the substrate 101 and the substrate 101 is less than the distance between the side of the second sub-anode 102*b* away from the substrate 101 and the substrate 101, so as to reduce the distance between an orthographic projection of the first sub-anode 102*a* on substrate 101 and an orthographic projection of the second sub-anode 102*b* on substrate 101, which improves the resolution of the display panel 100.

In some embodiments, the anodes 102 include first anode subparts 104. Each of the first anode subparts 104 is electrically connected to the drain through the through hole.

In some embodiments, each of the first anode subparts 104 includes a first electrode sublayer, a second electrode sublayer, and a third electrode sublayer that are sequentially stacked in a direction away from the substrate 101. Materials of the first electrode sublayer and the third electrode sublayer are transparent conductive materials, such as indium tin oxide, indium zinc oxide, zinc oxide, indium oxide, and other materials. A material of the second electrode sublayer is a conductive material with a reflective function, such as a conductive metal material (for example: magnesium, silver, gold, calcium, lithium, chromium, aluminum, or one or more of their alloys), etc.

A thickness of the first electrode sublayer is greater than or equal to 7 nm and is less than or equal to 60 nm. For example, the thickness of the first electrode sublayer may be 10 nm, 15 nm, 20 nm, 25 nm, 30 nm, 35 nm, 40 nm, 45 nm, 50 nm, or 55 nm. A thickness of the second electrode sublayer is greater than or equal to 50 nm, and the thickness of the first electrode sublayer is less than or equal to 100 nm. For example, the thickness of the second electrode sublayer may be 55 nm, 60 nm, 70 nm, 80 nm, 90 nm, 100 nm, 110 nm, 120 nm, 130 nm, or 140 nm. A thickness of the third electrode sublayer is greater than or equal to 7 nm and the thickness of the first electrode sublayer is less than or equal to 60 nm. For example, the thickness of the third electrode sublayer may be 10 nm, 15 nm, 20 nm, 25 nm, 30 nm, 35 nm, 40 nm, 45 nm, 50 nm, or 55 nm.

The difference between the distance between the side of the second sub-anode 102*b* away from the substrate 101 and the substrate 101 and the distance between the side of the first sub-anode 102*a* away from the substrate 101 and the substrate 101 is greater than or equal to the thickness of the second sub-anode 102*b*, which is beneficial to make the first sub-anode 102*a* and the second sub-anode 102*b* completely stagger along the direction away from the substrate 101, and further reducing the distance between the orthographic projection of the first sub-anode 102*a* on the substrate 101 and the orthographic projection of the second sub-anode 102*b* on the substrate 101, which improves the resolution of the display panel 100.

In some embodiments, the pixel definition layer 103 may be a single layer. The first sub-anode 102*a* is directly formed on the planarization layer 125. The first opening OP1*a* completely penetrates through the pixel definition layer 103. The second opening OP1*b* penetrates a part of the pixel definition layer 103, and the second sub-anode 102*b* is exposed in the second opening OP1*b*.

Referring to FIG. 1 to FIG. 6, in some embodiments, the first opening OP1*a* penetrates through the first pixel definition sublayer 107 and the second pixel definition sublayer 108, and the second opening OP1b penetrates through the second pixel definition sublayer 108.

The first sub-anode 102a is directly formed on the planarization layer 125, and the second sub-anode 102b is formed on the first pixel definition sublayer 107. The first opening OP1a exposes a part of a side of the first sub-anode 102a away from the substrate 101, and the second opening OP1b exposes a part of a side of the second sub-anode 102b away from the substrate 101.

The first pixel definition sublayer 107 further includes first via holes. The first via hole communicates with the through hole, and the second sub-anode 102b is connected to the auxiliary metal layer through the first via hole and the second through hole, so as to be connected to the drain.

In some embodiments, the anodes 102 further include one or more third sub-anodes 102c. The third sub-anode 102c is adjacent to the first sub-anode 102a and/or the second sub-anode 102b. The pixel definition openings OP1 further include one or more third openings OP1c. The third opening OP1c corresponds to the third sub-anode 102c and exposes at least a part of the third sub-anode 102c.

A depth of the third opening OP1c is less than or equal to the depth of the first opening OP1a.

In some embodiments, the third sub-anode 102c may be directly formed on the planarization layer 125 in the same way as the first sub-anode 102a, so as to be stagger with the second sub-anode 102b along the direction away from the substrate 101, which is beneficial to reduce a distance between an orthographic projection of the third sub-anode 102c on the substrate 101 and the orthographic projection of the second sub-anode 102b on the substrate 101, which improves the resolution of the display panel 100. At this time, a distance between a side of the third sub-anode 102c away from the substrate 101 and the substrate 101 is less than the distance between the side of the second sub-anode 102b away from the substrate 101 and the substrate 101. Preferably, a difference between the distance between the side of the second sub-anode 102b away from the substrate 101 and the substrate 101 and the distance between the side of the third sub-anode 102c away from the substrate 101 and the substrate 101 is greater than or equal to a thickness of the first anode subpart 104 corresponding to the second sub-anode 102b, which is beneficial to make the third sub-anode 102c and the second sub-anode 102b completely stagger along the direction away from substrate 101, further reducing a distance between an orthographic projection of the third sub-anode 102c on the substrate 101 and the orthographic projection of the second sub-anode 102b on the substrate 101, which improves the resolution of the display panel 100.

Referring to FIG. 3 to FIG. 6, in some embodiments, the second opening OP1b only penetrates the second pixel definition sublayer 108, and the third opening OP1c only penetrates the second pixel definition sublayer 108. At this time, the third sub-anode 102c is disposed on the same layer as the second sub-anode 102b. That is, the third sub-anode 102c may be formed on the first pixel definition sublayer 107 in the same way as the second sub-anode 102b, so as to be stagger with the first sub-anode 102a along the direction away from the substrate 101, which is beneficial to reduce a distance between an orthographic projection of third sub-anode 102c on substrate 101 and the orthographic projection of the first sub-anode 102a on substrate 101, which improves the resolution of the display panel 100. At this time, the first pixel definition sublayer 107 further includes second via holes. The second via hole communicates with the through hole. The third sub-anode 102c is connected to the auxiliary metal layer through the second via hole and the second through hole, so as to be connected to the drain. At this time, the distance between the side of the first sub-anode 102a away from the substrate 101 and the substrate 101 is less than the distance between the side of the third sub-anode 102c away from the substrate 101 and the substrate 101. Preferably, a difference between the distance between the side of the third sub-anode 102c away from the substrate 101 and the substrate 101 and the distance between the side of the first sub-anode 102a away from the substrate 101 and the substrate 101 is greater than or equal to a thickness of the first anode subpart 104 corresponding to the third sub-anode 102c, which is beneficial to make the third sub-anode 102c and the first sub-anode 102a completely stagger along the direction away from substrate 101, further reducing a distance between the orthographic projection of the third sub-anode 102c on substrate 101 and the orthographic projection of the first sub-anode 102a on substrate 101, which improves the resolution of the display panel 100.

Figure 2:
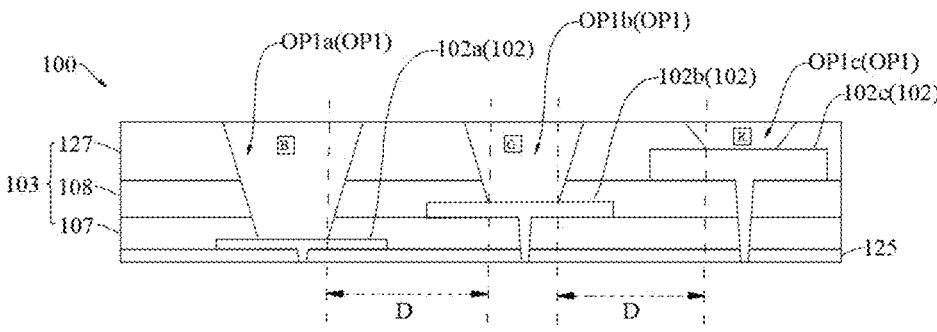
FIG. 2 is a partial schematic view of a second structure of a display panel according to an embodiment of the present disclosure.

Referring to FIG. 1 and FIG. 2, in some embodiments, the pixel definition layer 103 further includes a third pixel definition sublayer 127 disposed on a side of the second pixel definition sublayer 108 away from the substrate 101.

The third opening OP1c only penetrates the third pixel definition sublayer 127. The first opening OP1a penetrates the first pixel definition sublayer 107, the second pixel definition sublayer 108, and the third pixel definition sublayer 127. The second opening OP1b only penetrates the second pixel definition sublayer 108 and the third pixel definition sublayer 127. At this time, the third sub-anode 102c is disposed on the second pixel definition sublayer 108, the second sub-anode 102b is disposed on the first pixel definition sublayer 107, and the first sub-anode 102a is disposed on the planarization layer 125. The first sub-anode 102a, the second sub-anode 102b, and the third sub-anode 102c are stagger along the direction away from the substrate 101, which is beneficial to reduce distances between orthographic projections of the first sub-anode 102a, the second sub-anode 102b, and the third sub-anode 102c on the substrate 101, which improves the resolution of the display panel 100. At this time, the distance between the side of the third sub-anode 102c away from the substrate 101 and the substrate 101 is greater than the distance between the side of the second sub-anode 102b away from the substrate 101 and the substrate 101. Preferably, a difference between the distance between the side of the third sub-anode 102c away from the substrate 101 and the substrate 101 and the distance between the side of the second sub-anode 102b away from the substrate 101 and the substrate 101 is greater than or equal to the thickness of the first anode subpart 104 corresponding to the third sub-anode 102c, which is beneficial to make the third sub-anode 102c and the second sub-anode 102b completely stagger along the direction away from the substrate 101, further reducing the distance between the orthographic projection of the third sub-anode 102c on substrate 101 and the orthographic projection of the second sub-anode 102b on substrate 101, which improves the resolution of the display panel 100.

In some embodiments, the pixel definition part is made of an organic material and its patterning accuracy is limited. A barrier layer disposed on the pixel definition parts between the pixel definition openings OP1 may be provided to control a size of the pixel definition opening OP1 and a width of an orthographic projection of the pixel definition part between adjacent pixel definition openings OP1 on the substrate 101, so as to reduce a distance between adjacent anodes 102. The display panel 100 further includes the barrier layer disposed on the pixel definition layer 103. A material of the barrier layer is an inorganic material, such as indium tin oxide, indium zinc oxide, silicon oxide, silicon nitride, or other materials. The barrier layer may be removed after the pixel definition layer 103 is formed, so as to avoid affecting subsequent processes and functions of subsequent film layers. Alternatively, the barrier layer may remain in the display panel 100, and in this case, the material of the barrier layer is preferably an inorganic insulation material such as silicon oxide or silicon nitride, so as to avoid damage to subsequent processes and functions of subsequent film layers. The pixel definition layer 103 is made of an organic material, which is beneficial to fill a gap that may exist between the anode 102 and the inorganic barrier layer, so as to reduce the intrusion of water and oxygen into the organic layers. When the display panel 100 further includes the barrier layer disposed on the pixel definition layer 103, the barrier layer includes fifth openings corresponding to the pixel definition openings OP1, so as to expose the anodes 102 and avoid affecting subsequent processes. A thickness of the barrier layer is greater than or equal to 20 nm and is less than or equal to 100 nm. For example, the thickness of the barrier layer may be 40 nm, 50 nm, 60 nm, 80 nm, or 90 nm, etc.

Figure 5:
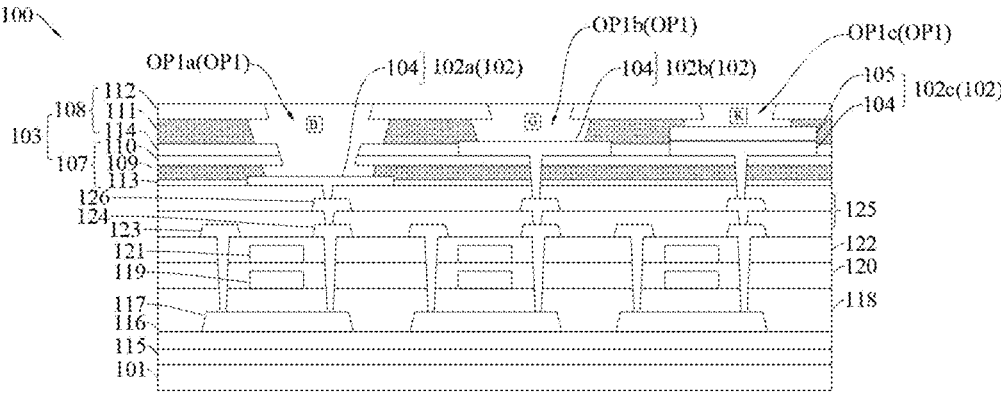
FIG. 5 is a schematic view of a fifth structure of a display panel according to an embodiment of the present disclosure.
Figure 6:
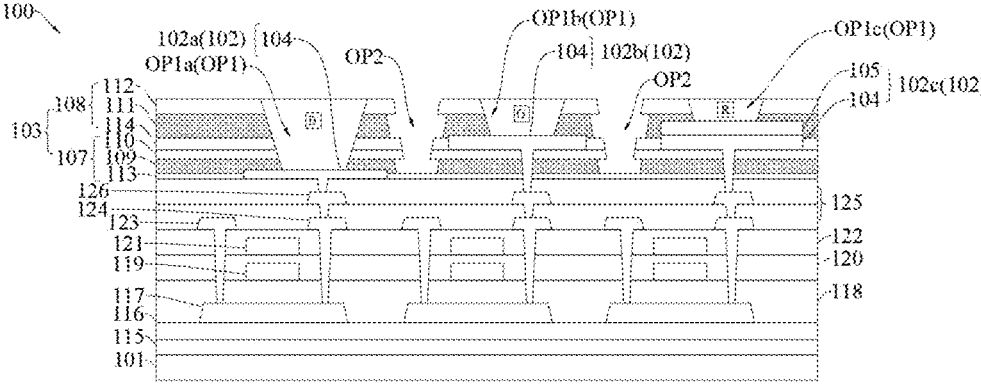
FIG. 6 is a schematic view of a sixth structure of a display panel according to an embodiment of the present disclosure.

Referring to FIG. 5 and FIG. 6, in some embodiments, the material of the pixel definition layer 103 is an inorganic material. The first pixel definition sublayer 107 includes a first inorganic sublayer 109 and a second inorganic sublayer 110 disposed on a side of the first inorganic sublayer 109 away from the substrate 101. The pixel definition openings OP1 include one or more first sub-openings each penetrating through the first inorganic sublayer 109 and one or more second sub-openings each penetrating through the second inorganic sublayer 110.

In some embodiments, an orthographic projection of the first sub-opening on the substrate 101 is located within an orthographic projection of the second sub-opening on the substrate 101.

In some embodiments, the orthographic projection of the second sub-opening on the substrate 101 is located within the orthographic projection of the first sub-opening on the substrate 101, that is, the second inorganic sublayer 110 is disposed on the side of the first inorganic sublayer 109 away from the substrate 101, an orthographic projection of the first inorganic sublayer 109 on the substrate 101 is located within an orthographic projection of the second inorganic sublayer 110 on the substrate 101.

In some embodiments, the second pixel definition sublayer 108 includes a third inorganic sublayer 111 and a fourth inorganic sublayer 112 disposed on a side of the third inorganic sublayer 111 away from the substrate 101. The pixel definition opening OP1 includes a third sub-opening penetrating through the third inorganic sublayer 111 and a fourth sub-opening penetrating through the fourth inorganic sublayer 112.

In some embodiments, an orthographic projection of the third sub-opening on the substrate 101 is located within an orthographic projection of the fourth sub-opening on the substrate 101.

In some embodiments, the orthographic projection of the fourth sub-opening on the substrate 101 is located within the orthographic projection of the third sub-opening on the substrate 101, that is, an orthographic projection of the third inorganic sublayer 111 on the substrate 101 is located within an orthographic projection of the fourth inorganic sublayer 112 on the substrate 101.

In some embodiments, the first pixel definition sublayer 107 further includes a fifth inorganic sublayer 113 disposed on a side of the first inorganic sublayer 109 adjacent to the substrate 101. The pixel definition openings OP1 include one or more fifth sub-openings each penetrating through the fifth inorganic sublayer 113.

In some embodiments, an orthographic projection of the fifth sub-opening on the substrate 101 is located within the orthographic projection of the first sub-opening on the substrate 101, that is, the orthographic projection of the first inorganic sublayer 109 on the substrate 101 is located within an orthographic projection of the fifth inorganic sublayer 113 on the substrate 101.

In some embodiments, the second pixel definition sublayer 108 further includes a sixth inorganic sublayer 114 disposed on a side of the third inorganic sublayer 111 adjacent to the substrate 101. The pixel definition opening OP1 includes a sixth sub-opening penetrating through the sixth inorganic sublayer 114.

An orthographic projection of the sixth sub-opening on the substrate 101 is located within the orthographic projection of the third sub-opening on the substrate 101, that is, the orthographic projection of the third inorganic sublayer 111 on the substrate 101 is located within an orthographic projection of the sixth inorganic sublayer 114 on the substrate 101.

In some embodiments, when the third sub-anode 102*c* and the second sub-anode 102*b* are disposed on the first pixel definition sublayer 107, or when the third sub-anode 102*c* and the first sub-anode 102*a* are disposed on the planarization layer 125, the pixel definition layer 103 is composed of the first pixel definition sublayer 107 and the second pixel definition sublayer 108. At this time, the first opening OP1*a* is composed of the first sub-opening, the second sub-opening, the third sub-opening, and the fourth sub-opening, or is composed of the first sub-opening, the second sub-opening, the third sub-opening, the fourth sub-opening, the fifth sub-opening, and the sixth sub-opening. The second opening OP1*b* is composed of the third sub-opening and the fourth sub-opening, or is composed of the third sub-opening, the fourth sub-opening, the fifth sub-opening, and the sixth sub-opening. A composition of the third opening OP1*c* is the same as that of the first opening OP1*a* or is the same as that of the second opening OP1*b*.

In some embodiments, the pixel definition layer 103 further includes a third pixel definition sublayer 127, and the third sub-anode 102*c* is disposed on the second pixel definition sublayer 108. When the third opening OP1*c* penetrates through the third pixel definition sublayer 127 to expose the third sub-anode 102*c*, the third pixel definition sublayer 127 includes a seventh inorganic sublayer and an eighth inorganic sublayer disposed on a side of the seventh inorganic sublayer away from the substrate 101. The pixel definition opening OP1 includes a seventh sub-opening penetrating through the seventh inorganic sublayer and an eighth sub-opening penetrating through the eighth inorganic sublayer.

In some embodiments, an orthographic projection of the seventh sub-opening on the substrate 101 is located within an orthographic projection of the eighth sub-opening on the substrate 101.

In some embodiments, the orthographic projection of the eighth sub-opening on the substrate 101 is located within the orthographic projection of the seventh sub-opening on the substrate 101, that is, an orthographic projection of the seventh inorganic sublayer on the substrate 101 is located within an orthographic projection of the eighth inorganic sublayer on the substrate 101.

In some embodiments, the third pixel definition sublayer 127 further includes a ninth inorganic sublayer disposed on a side of the seventh inorganic sublayer adjacent to the substrate 101. The pixel definition opening OP1 include a ninth sub-opening penetrating through the ninth inorganic sublayer.

In some embodiments, an orthographic projection of the ninth sub-opening on the substrate 101 is located within the orthographic projection of the seventh sub-opening on the substrate 101, that is, the orthographic projection of the seventh inorganic sublayer on the substrate 101 is located within an orthographic projection of the ninth inorganic sublayer on the substrate 101.

In some embodiments, when the pixel definition layer 103 further includes the third pixel definition sublayer 127, the third opening OP1*c* is composed of the seventh sub-opening and the eighth sub-opening, or is composed of the seventh sub-opening, the eighth sub-opening, and the ninth sub-opening. The first opening OP1*a* and the second opening OP1*b* add the seventh sub-opening and the eighth sub-opening to the original, or add the seventh sub-opening, the eighth sub-opening, and the ninth sub-opening to the original.

Figure 3:
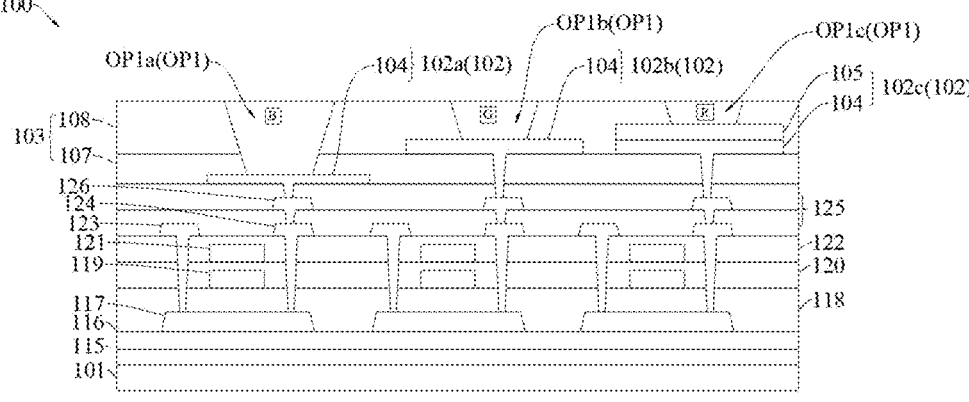
FIG. 3 is a schematic view of a third structure of a display panel according to an embodiment of the present disclosure.
Figure 4:
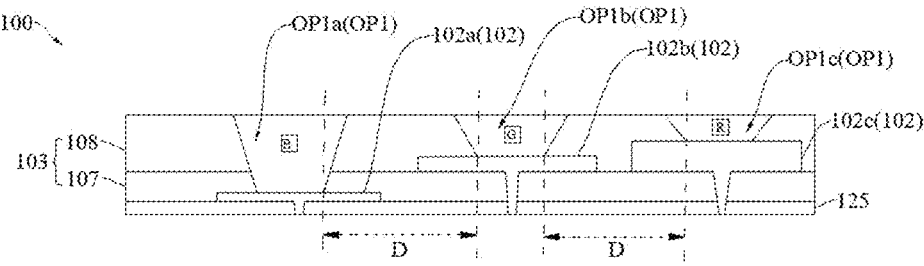
FIG. 4 is a partial schematic view of a fourth structure of a display panel according to an embodiment of the present disclosure.

Referring to FIG. 2 to FIG. 4, in some embodiments, the pixel definition layer 103 includes pixel definition parts each surrounding one of the pixel definition openings OP1. A width of an orthographic projection of the pixel definition part on the substrate 101 is less than 2.5 microns. For example, the width of the orthographic projection of the pixel definition part on the substrate 101 may be 2.3 microns, 2.2 microns, 2 microns, 1.8 microns, or 1.5 microns, etc. The width of the orthographic projection of the pixel definition part on the substrate 101 is defined as D, which refers to a distance of two ends of the orthographic projection of the pixel definition part spaced between adjacent anodes 102 on the substrate 101, and the two ends are adjacent to the adjacent anodes 102. When the material of the pixel definition layer 103 is an organic material, the barrier layer is configured to reduce the width of the orthographic projection of the pixel definition part on the substrate 101, which is beneficial to reduce the distance between the anodes 102. When the material of the pixel definition layer 103 is an inorganic material, an etching precision of the inorganic material is greater than that of the organic material, which is beneficial to reduce the distance between the anodes 102 and improve the resolution of the display panel 100.

In the pixel definition layer 103, thicknesses of the first pixel definition sublayer 107, the second pixel definition sublayer 108, and the third pixel definition sublayer 127 are all greater than or equal to 0.5 microns and are all less than or equal to 2 microns, for example, 0.8 microns, 1 micron, 1.2 microns, 1.4 microns, 1.5 microns, 1.6 microns, or 1.8 microns, etc.

In some embodiments, a distance between orthographic projections of adjacent anodes 102 on the substrate 101 is greater than or equal to 1 micron. For example, the distance between the orthographic projections of adjacent anodes 102 on the substrate 101 may be 2 microns, 1.8 microns, 1.6 microns, 1.5 microns, 1.4 microns, or 1.2 microns etc. By making the first sub-anode 102*a* and the second sub-anode 102*b* stagger along the direction away from the substrate 101, it is beneficial to reduce the distance between the anodes 102. At the same time, the reduction of the distance between adjacent pixel-defining openings OP1 is also beneficial to reduce the distance between the anodes 102, which improves the resolution of the display panel 100.

The organic layers are formed in the pixel definition openings OP1. The organic layers may include one or more light-emitting layers, a hole injection layer, a hole transport layer, an electron transport layer, and an electron injection layer. The hole injection layer is disposed on the anodes 102, the hole transport layer is disposed on the hole injection layer, the light-emitting layer is disposed on the hole transport layer, the electron transport layer is disposed on the light-emitting layer, and the electron injection layer is disposed on the electron transport layer.

When the material of the pixel definition layer 103 is an inorganic material, materials of the first inorganic sublayer 109 and the third inorganic sublayer 111 may be the same. When the third pixel definition sublayer 127 is provided, materials of the seventh inorganic sublayer and the first inorganic sublayer 109 may be the same and selected from silicon oxide (SiOx); and materials of the second inorganic sublayer 110, the fourth inorganic sublayer 112, the fifth inorganic sublayer 113, and the sixth inorganic sublayer 114 may be the same and selected from silicon nitride (SiNx). When the third pixel definition sublayer 127 is provided, materials of the eighth inorganic sublayer and the second inorganic sublayer 110 may be the same and selected from silicon nitride (SiNx); and a porosity degree of materials of the second inorganic sublayer 110 and the fourth inorganic sublayer 112 is greater than a porosity degree of materials of the first inorganic sublayer 109 and the third inorganic sublayer 111. That is, wet etching rates of the second inorganic sublayer 110 and the fourth inorganic sublayer 112 are greater than wet etching rates of the first inorganic sublayer 109 and the third inorganic sublayer 111, so as to form a structure of the orthographic projection of the second sub-opening on the substrate 101 covering the orthographic projection of the first sub-opening on the substrate 101, and the orthographic projection of the fourth sub-opening on the substrate 101 covering the orthographic projection of the third sub-opening on the substrate 101, thereby facilitating disconnection of at least one of the organic layers in adjacent pixel definition openings OP1, such as the hole injection layer and the hole transport layer, to avoid adverse effects.

Referring to FIG. 6, in some embodiments, the pixel definition layer 103 further includes fourth openings OP2 each disposed adjacent pixel definition openings OP1. The fourth opening OP2 at least penetrates through the pixel definition layer 103. The fourth opening OP2 may penetrate through the second pixel definition sublayer 108, or, the fourth opening OP2 may penetrate through the first pixel definition sublayer 107 and the second pixel definition sublayer 108. When the pixel definition layer 103 further includes the third pixel definition sublayer 127, the fourth opening OP2 may penetrate through the third pixel definition sublayer 127.

The arrangement of the fourth openings OP2 is also conducive to disconnecting at least one of the organic layers in adjacent pixel definition openings OP1, so as to improve the product quality of the display panel 100. An orthographic projection of a side of the fourth opening OP2 away from the substrate 101 on the substrate 101 covers an orthographic projection of a side of the fourth opening OP2 adjacent to the substrate 101 on the substrate 101.

When the fourth opening OP2 penetrates through the second pixel definition sublayer 108, the fourth opening OP2 may be formed in the same process as the second opening OP1*b*. When the fourth opening OP2 penetrates through the first pixel definition sublayer 107 and the second pixel definition sublayer 108, the fourth opening OP2 may be formed in the same process as the first opening OP1*a*. When the fourth opening OP2 penetrates through the third pixel definition sublayer 127, the fourth opening OP2 may be formed in the same process as the third opening OP1*c*.

The cathode is formed on the pixel definition layer 103 and the organic layers. A material of the cathode may include a transparent conductive material, such as indium tin oxide, indium zinc oxide, zinc oxide, indium oxide, and other materials.

The anodes 102, the organic layers, and the cathode form organic light-emitting elements.

In some embodiments, the display panel 100 includes red organic light-emitting elements, green organic light-emitting elements and blue organic light-emitting elements. Correspondingly, the anodes 102 include first sub-anodes 102*a*, second sub-anodes 102*b*, and third sub-anodes 102*c*. The display panel 100 further includes a first light-emitting layer disposed in the first openings OP1*a* and disposed on a side of the first sub-anodes 102*a* away from the substrate 101, a second light-emitting layer disposed in the second openings OP1*b* and disposed on a side of the second sub-anodes 102*b* away from the substrate 101, and a third light-emitting layer disposed in the third openings OP1*c* and disposed on a side of the third sub-anodes 102*c* away from the substrate 101.

Since colors of the light emitted by the first light-emitting layer, the second light-emitting layer, and the third light-emitting layer are different, so that wavelengths of the light emitted by the three are different. In order to improve light extraction efficiency of the red organic light-emitting element, the green organic light-emitting element, and the blue organic light emitting element, cavity length requirements of the red organic light-emitting element, the green organic light-emitting element and the blue organic light emitting element are different. That is, the red organic light-emitting element, the green organic light-emitting element and the blue organic light emitting element requires different distances between the second electrode sublayer of the first anode subpart 104 and the cathode. The cavity lengths of the red organic light-emitting element, the green organic light-emitting element and the blue organic light emitting element decrease successively. Specifically, thicknesses of the first sub-anode 102*a*, the second sub-anode 102*b*, and the third sub-anode 102*c* are different.

When the light emitted by the first light-emitting layer B is blue, the light emitted by the second light-emitting layer G is green, and the light emitted by the third light-emitting layer R is red, that is, when the first light-emitting light layer B is a blue light-emitting layer, the second light-emitting layer G is a green light-emitting layer, and the third light-emitting layer R is a red light-emitting layer, thicknesses of the first sub-anode 102*a*, the second sub-anode 102*b*, and the third sub-anode 102*c* increases sequentially.

In some embodiments, due to the different sensitivities of human eyes to light of different colors, requirements for light-emitting areas of the red organic light-emitting element, the green organic light-emitting element and the blue organic light emitting element in the display panel 100 are different. Areas of orthographic projections of the first sub-anode 102*a*, the second sub-anode 102*b*, and the third sub-anode 102*c* on the substrate 101 are correspondingly different. Human eyes are most sensitive to green light, therefore, the area of the orthographic projection of the second sub-anode 102*b* on the substrate 101 is less than the area of the orthographic projection of the first sub-anode

102*a* on the substrate 101 and is less than the area of the orthographic projection of the third sub-anode 102*c* on the substrate 101.

Referring to FIG. 1 to FIG. 3, in some embodiments, when the light emitted by the first light-emitting layer B is blue, the light emitted by the second light-emitting layer G is green, and the light emitted by the third light-emitting layer R is red, the thicknesses of the first sub-anode 102*a*, the second sub-anode 102*b*, and the third sub-anode 102*c* increase sequentially. When the first sub-anode 102*a* is disposed on the planarization layer 125, and the second sub-anode 102*b* and the third sub-anode 102*c* are disposed on the second pixel definition sublayer 108, the anodes 102 further include second anode subparts 105 disposed on sides of the first anode subparts 104 corresponding to the third sub-anodes 102*c* away from the substrate 101. At this time, the thickness of the first anode subpart 104 corresponding to the first sub-anode 102*a* is less than the thickness of the first anode subpart 104 corresponding to the second sub-anode 102*b*, and the thickness of the first anode subpart 104 corresponding to the second sub-anode 102*b* is equal to the thickness of the first anode subpart 104 corresponding to the third sub-anode 102*c*. When the thickness of the first anode subpart 104 corresponding to the first sub-anode 102*a*, the thickness of the first anode subpart 104 corresponding to the second sub-anode 102*b*, and the thickness of the first anode subpart 104 corresponding to the third sub-anode 102*c* are equal, the second anode subparts 105 are also disposed on sides of the first anode subparts 104 corresponding to the second sub-anodes 102*b* away from the substrate 101, and the anodes 102 further include third anode subparts disposed on sides of the second anode subparts 105 corresponding to the third sub-anode 102*c* the away from the substrate 101.

Preferably, the anodes 102 include the first anode subparts 104 and the second anode subparts 105. The first sub-anode 102*a* is composed of the first anode subpart 104, the second sub-anode 102*b* is composed of the first anode subpart 104, and the third sub-anode 102*c* is composed of the first anode subpart 104 and the second anode subpart 105. Herein, the thickness of the first anode subpart 104 corresponding to the first sub-anode 102*a* is less than the thickness of the first anode subpart 104 corresponding to the second sub-anode 102*b* and is less than the thickness of the first anode subpart 104 corresponding to the third sub-anode 102*c*. The thickness of the first anode subpart 104 corresponding to the second sub-anode 102*b* may be equal to the thickness of the first anode subpart 104 corresponding to the third sub-anode 102*c*. Through the superposition of the first anode sub-opening 104 and the second anode sub-opening 105 and the difference in thickness between the first anode sub-opening 104 corresponding to the first sub-anode 102*a* and the first anode sub-opening 104 corresponding to the second sub-anode 102*b*, thus it is easy to achieve different thicknesses of the first sub-anode 102*a*, the second sub-anode 102*b*, and the third sub-anode 102*c* in the process.

When the pixel definition layer 103 further includes the third pixel definition sublayer 127, each of the first sub-anode 102*a*, the second sub-anode 102*b*, and the third sub-anode 102*c* is correspondingly composed of the first anode subpart 104. The thickness of the first anode subpart 104 corresponding to the third sub-anode 102*c*, the thickness of the first anode subpart 104 corresponding to the second sub-anode 102*b*, and the thickness of the first anode subpart 104 corresponding to the first sub-anode 102*a* decreases successively. Alternatively, the anodes 102 further include fourth anode subparts 106 disposed on sides of the first anode subparts 104 corresponding to the third sub-anodes 102*c* away from the substrate 101. A sum of thicknesses of the first anode subpart 104 and the fourth anode subpart 106 corresponding to the third sub-anode 102*c* is greater than the thickness of the second sub-anode 102*b* and is greater than the thickness of the first sub-anode 102*a*.

Materials of the second anode subpart 105, the third anode subpart, and the fourth anode subpart 106 are selected from transparent conductive materials, such as indium tin oxide, indium zinc oxide, and other materials. The thickness of each of the second anode subpart 105, the third anode subpart, and the fourth anode subpart 106 is greater than or equal to 7 nm, and the thickness of the second anode subpart 105 is less than or equal to 200 nm. For example, the thickness of the second anode subpart 105 may be 10 nm, 20 nm, 40 nm, 50 nm, 60 nm, 70 nm, 80 nm, 90 nm, 100 nm, 110 nm, 120 nm, 140 nm, 150 nm, 160 nm, 170 nm, 180 nm, or 190 nm etc., so as to realize the control of the cavity lengths of the red organic light-emitting element and the green organic light-emitting element, thereby improving luminous efficiency of the display panel 100.

The package layer formed on the cathode. The package layer may be formed by alternately laminating one or more organic layers and one or more inorganic layers. The inorganic layer or the organic layer may be provided in plural. The organic layer is made of a polymer, and may be, for example, a laminate layer or single layer, made of any of polyethylene terephthalate, polyimide, polycarbonate, epoxy resin, polyethylene, or polyacrylate. The organic layer may be made of polyacrylate, specifically include a substance obtained by polymerizing a composition including a diacrylate-based monomer and a triacrylate-based monomer. The monomer composition may further include a monoacrylate-based monomer. In addition, a well-known photoinitiator such as TPO may also be included in the monomer composition, but the monomer composition is not limited thereto. The inorganic layer may be a laminated layer or a single layer including metal oxide or metal nitride. For example, the inorganic layer may include any one of SiNx, Al2O3, SiO2, or TiO2.

In some embodiments, the package layer may sequentially include a first inorganic package layer, a first organic package layer, and a second inorganic package layer disposed on the cathode along a direction away from the substrate 101. Furthermore, the package layer may sequentially include a first inorganic package layer, a first organic package layer, a second inorganic package layer, a second organic package layer, and a third inorganic package layer disposed on the cathode along a direction away from the substrate 101. Furthermore, the package layer may sequentially include a first inorganic package layer, a first organic package layer, a second inorganic package layer, a second organic package layer, a third inorganic package layer, a third organic package layer, and a fourth inorganic package layer disposed on the cathode along a direction away from the substrate 101.

In some embodiments, the display panel 100 further includes a metal halide layer between the package layer and the cathode. The metal halide layer may include LiF. The metal halide layer can prevent the cathode from being destroyed when the first inorganic layer of the package layer is formed by sputtering or plasma deposition.

In some embodiments, the display panel 100 further includes spacer columns disposed on a side of the pixel definition parts away from the substrate 101. A material of the spacer column is an organic material, which is configured to separate a photomask during the formation of the organic layers, so as to protect structures such as the pixel definition parts in the display panel 100.

In the embodiments of the present disclosure, the distance between the side of the first sub-anode 102*a* away from the substrate 101 and the substrate 101 and the distance between the side of the second sub-anode 102*b* away from the substrate 101 and the substrate 101 are different, so that the first sub-anode 102*a* and the second sub-anode 102*b* are stagger along the direction away from the substrate 101. That the first sub-anode 102*a* and the second sub-anode 102*b* are respectively formed at different distances from the substrate 101 is beneficial to improve the respective formation precision of the first sub-anode 102*a* and the second sub-anode 102*b*, thereby reducing the distance between an orthographic projection of the first sub-anode 102*a* on the substrate 101 and an orthographic projection of the second sub-anode 102*b* on the substrate 101, which improves the resolution of the display panel 100.

Referring to FIG. 7, FIG. 8A to FIG. 8J, and FIG. 9A to FIG. 9F, embodiments of the present disclosure further provide a manufacturing method of a display panel, including steps S100, S200, and S300.

The step S100 includes: providing a substrate 101.

In this embodiment, the material of the substrate 101 and the specific structure of the substrate 101 have been described in detail in the aforementioned display panel 100, and will not be repeated here.

The step S200 includes: forming anodes 102 on the substrate 101, the anodes 102 including at least one first sub-anode 102*a* and at least one second sub-anode 102*b* adjacent to the first sub-anode 102*a*.

In some embodiments, the step S200 further includes steps S210, S220, S230, and S240.

Referring to FIG. 8A, the step S210 includes: forming the first sub-anode 102*a* on the substrate 101.

Figure 8B:
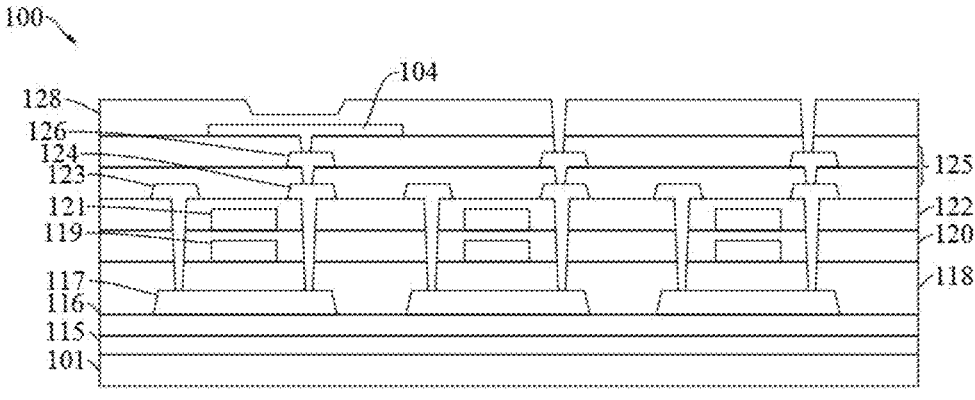
Figure 9A:
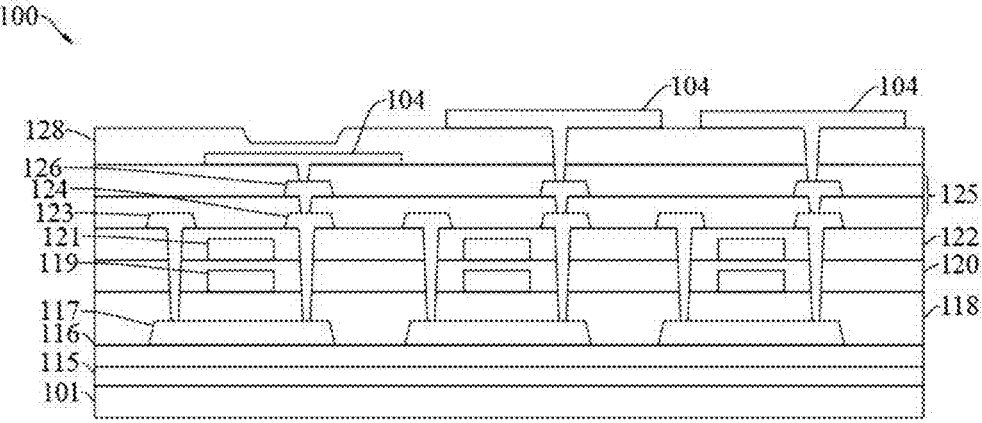
FIG. 9A to FIG. 9F are schematic views showing a second flow chart of a manufacturing method of a display panel according to an embodiment of the present disclosure.

Referring to FIG. 8B and FIG. 9A, the step S220 includes: forming a first pixel definition material layer 128 on the substrate 101.

In some embodiments, a material of the first pixel definition material layer is an organic material. The first pixel definition material layer 128 includes at least one first pixel definition sub-opening corresponding to the first sub-anode 102*a*. The first pixel definition sub-opening does not expose the first sub-anode 102*a*.

In some embodiments, the material of the first pixel definition material layer 128 is an inorganic material, and at this time, the first pixel-defining material layer 128 is not provided with the first pixel defining sub-openings. The first pixel definition material layer 128 includes a first inorganic material sublayer, a second inorganic material sublayer disposed on a side of the first inorganic material sublayer away from the substrate 101, and a fifth inorganic material sublayer disposed on a side of the first inorganic material sublayer adjacent to the substrate 101.

Figure 8C:
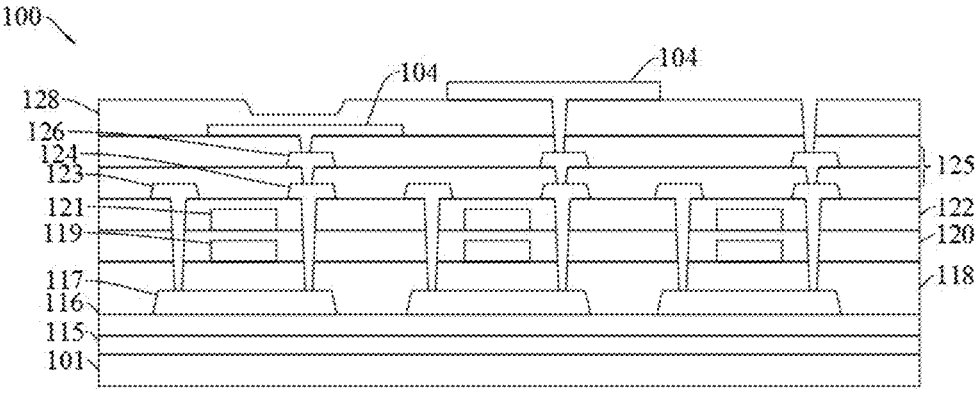
Figure 9B:
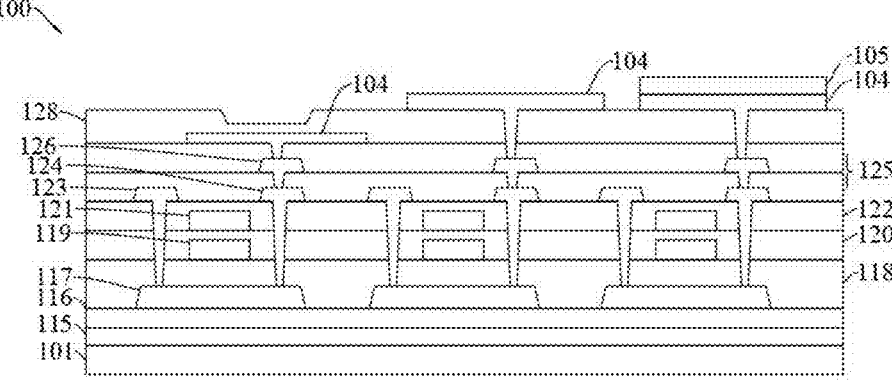

Referring to FIG. 8C and FIG. 9B, the step S230 includes: forming the second sub-anode 102*b* on the first pixel definition material layer 128.

Figure 8D:
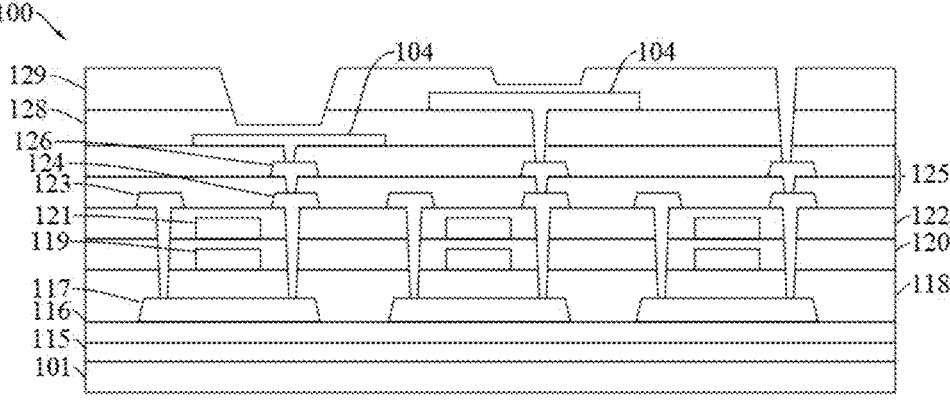
Figure 9C:
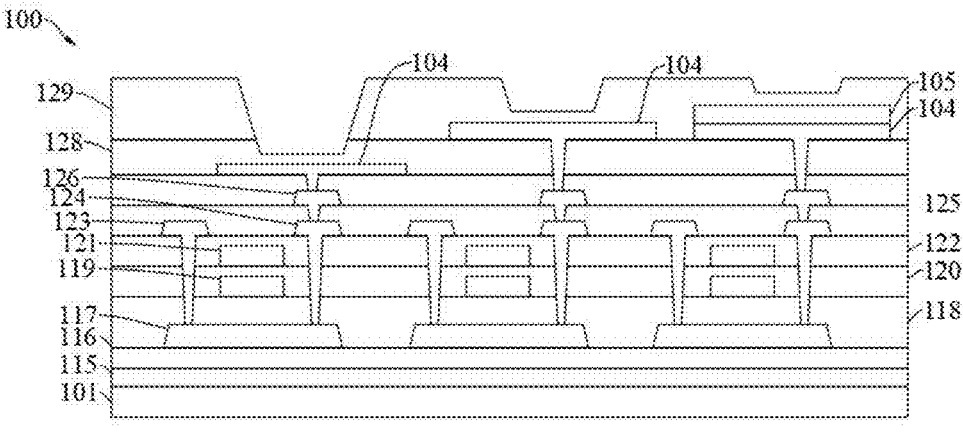

Referring to FIG. 8D and FIG. 9C, the step S240 includes: forming a second pixel definition material layer 129 on the first pixel definition material layer 128.

In some embodiments, a material of the second pixel definition material layer 129 is an organic material. The second pixel definition material layer 129 includes second pixel definition sub-openings corresponding to the first sub-anode 102*a* and the second sub-anode 102*b*. The second pixel definition sub-opening does not expose the second sub-anode 102*b*, and the second pixel definition sub-opening corresponding to the first sub-anode 102a communicates with the first pixel definition sub-opening.

In some embodiments, the material of the second pixel definition material layer 129 is an inorganic material, and at this time, the second pixel definition material layer 129 is not provided with the second pixel definition sub-openings. The second pixel definition material layer 129 includes a third inorganic material sublayer, a fourth inorganic material sublayer disposed on a side of the third inorganic material sublayer away from the substrate 101, and a sixth inorganic material sublayer disposed on a side of the third inorganic material sublayer adjacent to the substrate 101.

When the anodes 102 further include the third sub-anode 102c, the third sub-anode 102c may be formed simultaneously with the first sub-anode 102a, or formed simultaneously with the second sub-anode 102b.

When the third sub-anode 102c is formed simultaneously with the first sub-anode 102a, the first pixel definition sub-openings correspond to the first sub-anode 102a and the third sub-anode 102c. The first pixel definition sub-opening does not expose the first sub-anode 102a and the third sub-anode 102c. When the third sub-anode 102c is formed simultaneously with the second sub-anode 102b, the second pixel definition sub-openings correspond to the first sub-anode 102a, the second sub-anode 102b, and the third sub-anode 102c. The second pixel definition sub-opening does not expose the second sub-anode 102b and the third sub-anode 102c.

In some embodiments, when the second sub-anode 102b and the third sub-anode 102c are simultaneously formed, the step S230 include:

a step S231, forming the first anode subparts 104 corresponding to the second sub-anode 102b and the third sub-anode 102c on the first pixel definition material layer 128; and a step S232, forming the second anode subpart 105 on the first anode subpart 104 corresponding to the third sub-anode 102c.

In some embodiments, after the step 240, the step 200 further includes steps S250 and S260.

Figure 8E:
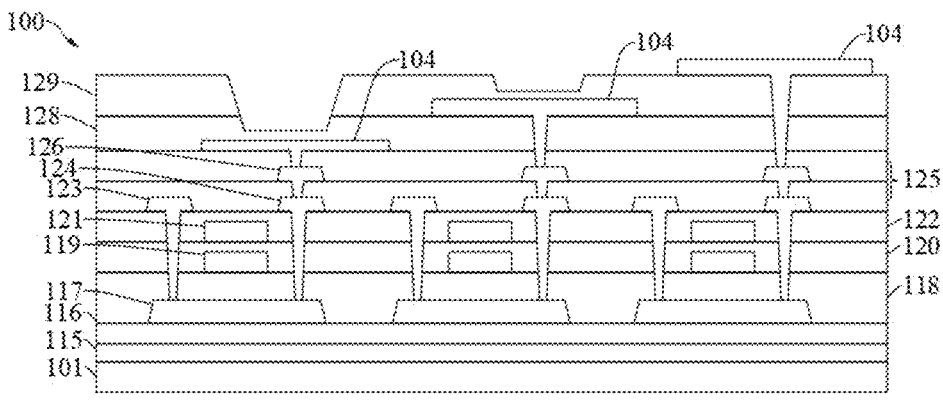
Figure 8F:
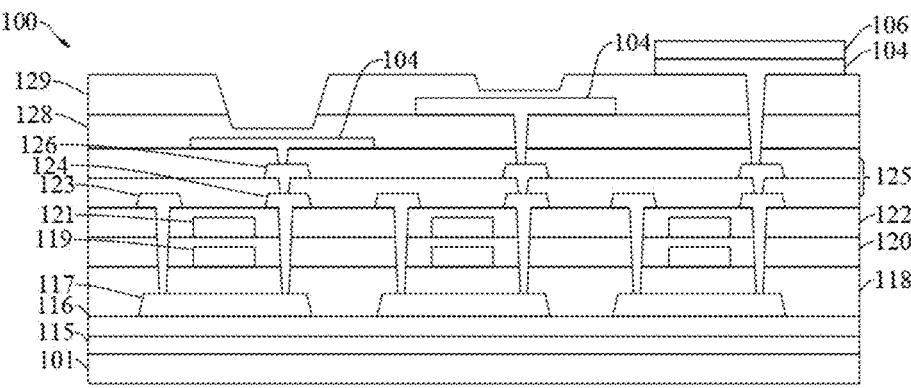

Referring to FIG. 8E and FIG. 8F, the step S250 includes: forming the third sub-anode 102c on the second pixel definition material layer 129.

Figure 8G:
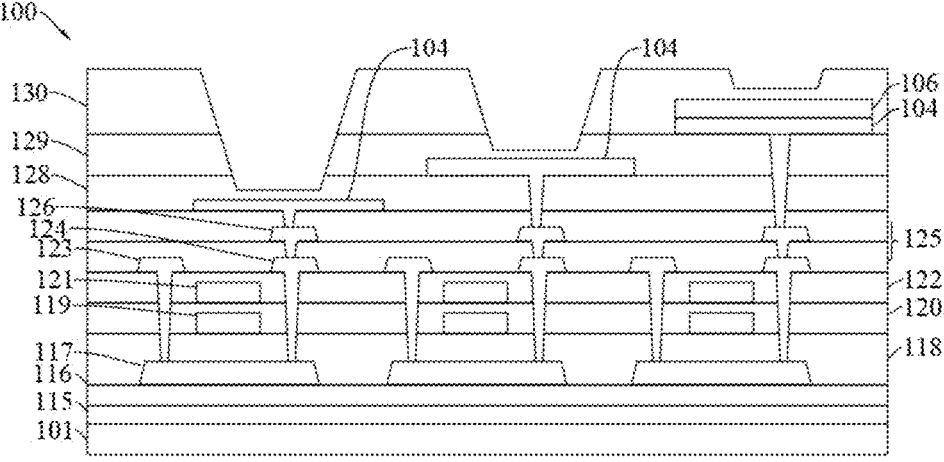

Referring to FIG. 8G, the step S260 includes: forming a third pixel definition material layer 130 on the second pixel definition material layer 129.

In some embodiments, a material of the third pixel definition material layer 130 is an organic material. The third pixel definition material layer 130 includes third pixel definition sub-openings corresponding to the first sub-anode 102a, the second sub-anode 102b, and the third sub-anode 102c. The third pixel definition sub-opening does not expose the third sub-anode 102c. The third pixel definition sub-opening corresponding to the first sub-anode 102a communicates with the second pixel definition sub-opening corresponding to the first sub-anode 102a. The third pixel definition sub-opening corresponding to the second sub-anode 102b communicates with the second pixel definition sub-opening corresponding to the second sub-anode 102b.

Apart of the first pixel definition material layer corresponding to the first pixel definition sub-openings, a part of the second pixel definition material layer corresponding to the second pixel definition sub-openings, and a part of the third pixel definition material layer corresponding to the third pixel definition sub-openings are remained, which is beneficial to reduce the difference in etching height when forming the first openings OP1a, the second openings OP1b, and the third openings OP1c in subsequent processes and reduce the etching risk thereof, thereby improving a product yield of the display panel 100.

In some embodiments, the material of the third pixel definition material layer 130 is an inorganic material, and at this time, the third pixel definition material layer 130 is bot provided with the third pixel definition sub-openings. The third pixel definition material layer 130 includes a seventh inorganic material sublayer, an eighth inorganic material sublayer disposed on a side of the seventh inorganic material sublayer away from the substrate 101, and a ninth inorganic material sublayer disposed on a side of the seventh inorganic material sublayer adjacent to the substrate 101.

The first sub-anode 102a, the second sub-anode 102b, and the third sub-anode 102c may all be formed by wet etching processes.

The structures and materials of the first sub-anode 102a, the second sub-anode 102b, and the third sub-anode 102c have been described in detail in the aforementioned display panel 100, and will not be repeated here.

The step S300 includes: forming a pixel definition layer 103 on the substrate 101, the pixel definition layer 103 including pixel definition openings OP1 which include at least one first opening OP1a corresponding to the first sub-anode 102a and at least one second opening OP1b corresponding to the second sub-anode 102b.

Figure 9D:
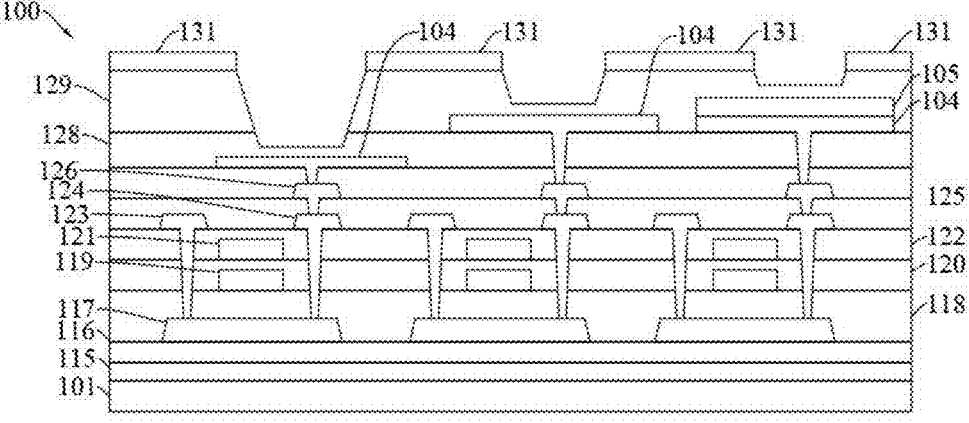
Figure 9E:
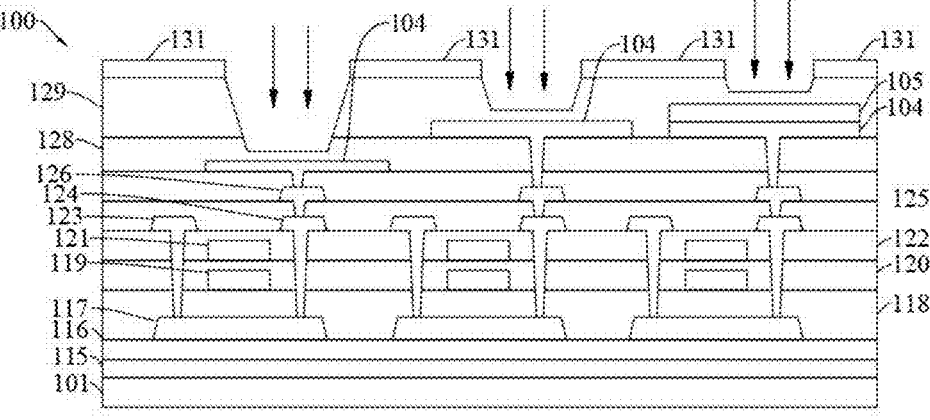
Figure 9F:
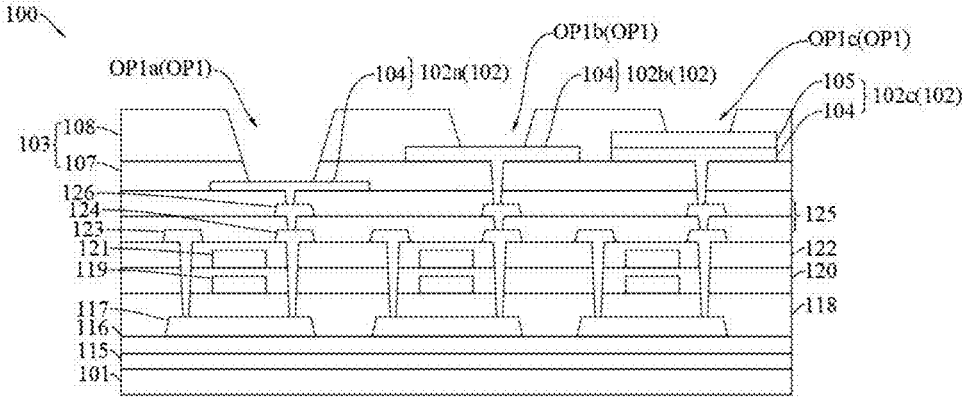

Referring to FIG. 9D to FIG. 9F, in some embodiments, when the material of the pixel definition material layer is the organic material, the step S300 includes:

a step S310, forming a barrier layer 131 on the second pixel definition material layer 129; and a step S320, subjecting the first pixel definition material layer 128 and the second pixel definition material layer 129 to a first ashing treatment to form the pixel definition layer 103.

Alternatively, the step S300 includes steps S330 and S340.

Figure 8H:
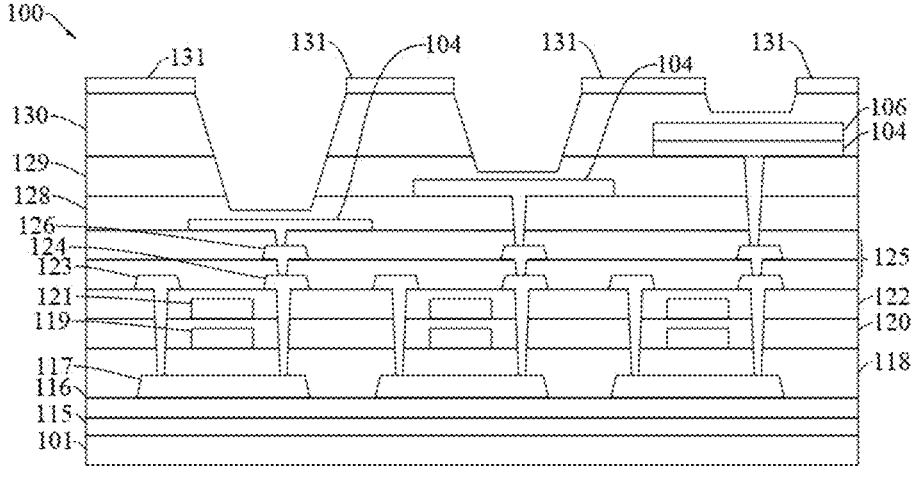

Referring to FIG. 8H, the step S330 includes: forming the barrier layer 131 on the third pixel definition material layer 130.

Figure 8I:
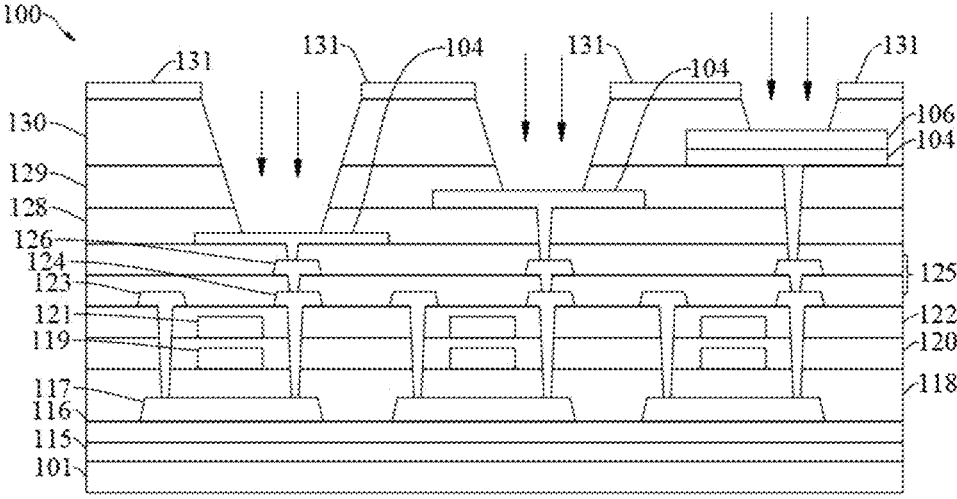

Referring to FIG. 8I, the step S340 includes: subjecting the first pixel definition material layer, the second pixel definition material layer, and the third pixel definition material layer to a second ashing treatment to form the pixel definition layer 103.

The barrier layer is disposed on the pixel definition layer 103. The barrier layer 131 includes fifth openings corresponding to the pixel definition openings OP1.

The barrier layer 131 may be formed by a wet etching process. the first ashing treatment is configured to remove the part of the first pixel definition material layer corresponding to the first pixel definition sub-openings and the part of the second pixel definition material layer corresponding to the second pixel definition sub-openings, so as to expose the first sub-anode 102a, the second sub-anode 102b, and the third sub-anode 102c. Alternatively, the second ashing treatment is configured to remove the part of the first pixel definition material layer corresponding to the first pixel definition sub-openings, the part of the second pixel definition material layer corresponding to the second pixel definition sub-openings, and the part of the third pixel definition material layer corresponding to the second pixel definition sub-openings, so as to expose the first sub-anode 102a, the second sub-anode 102b, and the third sub-anode 102c.

Figure 8J:
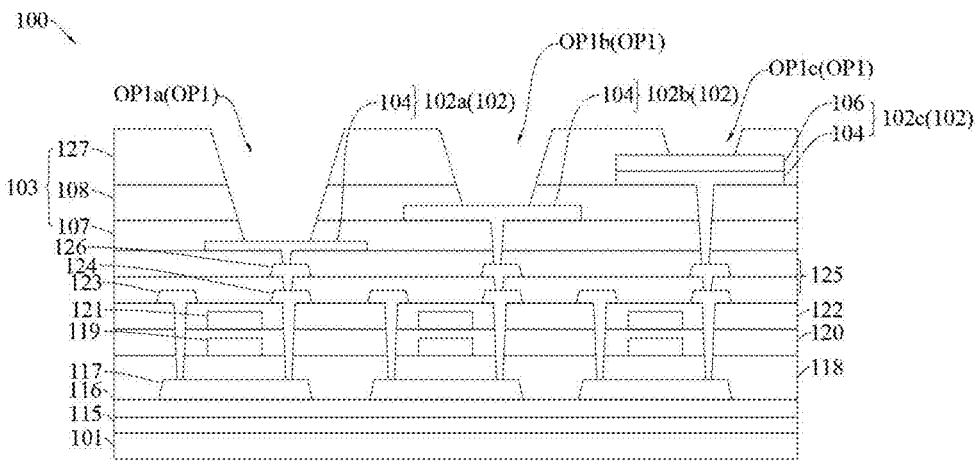

Referring to FIG. 8J, in some embodiments, the step S300 further includes: removing the barrier layer 131.

In some embodiments, when the material of the pixel definition layer is the inorganic material, the step S300 includes:

a step S350, subjecting the first pixel definition material layer 128 and the second pixel definition material layer 129 to a first patterning treatment to form the first pixel definition sublayer 107 and the second pixel definition sublayer 108.

In some embodiments, the step S350 includes steps S351 and S352.

The step S351 includes: subjecting the second pixel definition material layer 129 to a first sub-patterning treatment to form the second pixel definition sublayer 108.

The third inorganic material sublayer, the fourth inorganic material sublayer, and the sixth inorganic material sublayer form the third inorganic sublayer 111, the fourth inorganic sublayer 112, and the sixth inorganic sublayer 114.

The step S352 includes: subjecting the first pixel definition material layer 128 to a second sub-patterning treatment to form the first pixel definition sublayer 107.

The first inorganic material sublayer, the second inorganic material sublayer, and the fifth inorganic material sublayer form the first inorganic sublayer 109, the second inorganic sublayer 110, and the fifth inorganic sublayer 113.

In some embodiments, the step S300 includes:

a step S360, subjecting the first pixel definition material layer 128, the second pixel definition material layer 129, and the third pixel definition material layer 130 to a second patterning treatment to form the first pixel definition sublayer 107, the second pixel definition sublayer 108, and the third pixel definition sublayer 127.

The step S360 includes steps S361 and S362.

The step S361 includes: subjecting the third pixel definition material layer 130 to a third sub-patterning treatment to form the third pixel definition sublayer 127.

The seventh inorganic material sublayer, the eighth inorganic material sublayer, and the ninth inorganic material sublayer form the seventh inorganic sublayer, the eighth inorganic sublayer, and the ninth inorganic sublayer.

The step S362 includes: subjecting the second pixel definition material layer 129 to a fourth sub-patterning treatment to form the second pixel definition sublayer 108.

The step S362 further includes: subjecting the first pixel definition material layer 128 to a fifth sub-patterning treatment to form the first pixel definition sublayer 107.

In some embodiments, the first sub-patterning treatment to the fifth sub-patterning treatment may all be dry etching processes. At this time, an orthographic projection of the first sub-opening penetrating through the first inorganic sublayer 109 on the substrate 101 is located within an orthographic projection of the second sub-opening penetrating through the second inorganic sublayer 110 on the substrate 101; an orthographic projection of the third sub-opening penetrating through the third inorganic sublayer 111 on the substrate 101 is located within an orthographic projection of the fourth sub-opening penetrating through the fourth inorganic sublayer 112 on the substrate 101; and an orthographic projection of the seventh sub-opening penetrating through the seventh inorganic sublayer on the substrate 101 is located within an orthographic projection of the eighth sub-opening penetrating through the eighth inorganic sublayer on the substrate 101.

In some embodiments, the first sub-patterning treatment to the fifth sub-patterning treatment may all be dry etching processes each followed by a wet etching process. At this time, the orthographic projection of the second sub-opening penetrating through the second inorganic sublayer 110 on the substrate 101 is located within the orthographic projection of the first sub-opening penetrating through the first inorganic sublayer 109 on the substrate 101; the orthographic projection of the fourth sub-opening penetrating through the fourth inorganic sublayer 112 on the substrate 101 is located within the orthographic projection of the third sub-opening penetrating through the third inorganic sublayer 111 on the substrate 101; and the orthographic projection of the eighth sub-opening penetrating through the eighth inorganic sublayer on the substrate 101 is located within the orthographic projection of the seventh sub-opening penetrating through the seventh inorganic sublayer on the substrate 101.

The structure and materials of the pixel definition layer 103 have been described in detail in the aforementioned display panel 100, and will not be repeated here.

In some embodiments, after the step S300, the manufacturing method of the display panel further includes:

a step S400, forming spacer columns on the pixel definition parts.

In some embodiments, between the steps S100 and S200, the manufacturing method of the display panel further includes steps of forming a barrier layer, a buffer layer, a thin film transistor layer, a planarization layer 125, and an auxiliary metal layer. Structures and materials of the barrier layer, the buffer layer, the thin film transistor layer, the planarization layer 125, and the auxiliary metal layer have been described in detail in the aforementioned display panel 100, and will not be repeated here.

In the manufacturing method of the display panel provided in embodiments of the present disclosure, the distance between the side of the first sub-anode 102a away from the substrate 101 and the substrate 101 and the distance between the side of the second sub-anode 102b away from the substrate 101 and the substrate 101 are different, so that the first sub-anode 102a and the second sub-anode 102b are stagger along the direction away from the substrate 101, and the first sub-anode 102a and the second sub-anode 102b are respectively formed at different distances from the substrate 101. It is beneficial to improve the respective formation precision of the first sub-anode 102a and the second sub-anode 102b, thereby reducing the distance between the orthographic projection of the first sub-anode 102a on the substrate 101 and the orthographic projection of the second sub-anode 102b on the substrate 101, which improves the resolution of the display panel 100.

Embodiments of the present disclosure provide a display panel, including a substrate, anodes disposed on the substrate, and a pixel definition layer. The anodes include at least one first sub-anode and at least one second sub-anode adjacent to the first sub-anode. The difference between the first distance between a side of the first sub-anode away from the substrate and the substrate and the second distance between a side of the second sub-anode away from the substrate and the substrate is greater than or equal to the thickness of the second sub-anode. In the present disclosure, the first sub-anode and the second sub-anode are stagger along the direction away from the substrate, so that it is beneficial to improve the respective formation precision of the first sub-anode and the second sub-anode, thereby reducing the distance between the orthographic projection of the first sub-anode on substrate and the orthographic projection of the second sub-anode on substrate, which improves the resolution of the display panel 100.

It can be understood that those skilled in the art can make equivalent replacements or changes according to the technical solutions and inventive concept of the present disclosure, and all these changes or replacements should fall within the protection scope of the appended claims of the application.

The invention claimed is:

1. A display panel, comprising:

a substrate;

anodes, disposed on the substrate and comprising at least one first sub-anode and at least one second sub-anode adjacent to the first sub-anode; and a pixel definition layer disposed on a side of the first sub-anode away from the substrate, wherein a difference between a first distance between a side of the first sub-anode away from the substrate and the substrate and a second distance between a side of the second sub-anode away from the substrate and the substrate is greater than or equal to a thickness of the second sub-anode;

wherein at least a part of the pixel definition layer is disposed on a side of the second sub-anode adjacent to the substrate;

wherein the pixel definition layer comprises a first pixel definition sublayer disposed on the side of the second sub-anode adjacent to the substrate and a second pixel definition sublayer disposed on a side of the first pixel definition sublayer away from the substrate;

wherein the pixel definition layer further comprises pixel definition openings, and the pixel definition openings comprise a first opening corresponding to the first sub-anode and a second opening corresponding to the second sub-anode;

the first opening exposes at least a part of the first sub-anode, and the second opening exposes at least a part of the second sub-anode; and a depth of the first opening is greater than a depth of the second opening; and wherein the first pixel definition sublayer comprises a first inorganic sublayer and a second inorganic sublayer disposed on a side of the first inorganic sublayer away from the substrate; the first opening comprises a first sub-opening penetrating through the first inorganic sublayer and a second sub-opening penetrating through the second inorganic sublayer; and an orthographic projection of the second sub-opening on the substrate is located within an orthographic projection of the first sub-opening on the substrate.

2. The display panel according to claim 1, wherein the first opening penetrates through the first pixel definition sublayer and the second pixel definition sublayer, and the second opening penetrates through the second pixel definition sublayer.

3. The display panel according to claim 2, wherein the anodes further comprise at least one third sub-anode disposed adjacent to the first sub-anode, or adjacent to the first sub-anode and the second sub-anode, or adjacent to the second sub-anode, the pixel definition openings further comprise a third opening corresponding to the third sub-anode, the third opening exposes at least a part of the third sub-anode, and a depth of the third opening is less than or equal to the depth of the first opening.

4. The display panel according to claim 3, wherein the second opening only penetrates through the second pixel definition sublayer, and the third opening only penetrates through the second pixel definition sublayer.

5. The display panel according to claim 3, wherein the pixel definition layer further comprises a third pixel definition sublayer disposed on a side of the second pixel definition sublayer away from the substrate; and the third opening only penetrates through the third pixel definition sublayer, the first opening penetrates through the first pixel definition sublayer, the second pixel definition sublayer, and the third pixel definition sublayer, and the second opening only penetrates through the second pixel definition sublayer and the third pixel definition sublayer.

6. The display panel according to claim 3, further comprising a blue light-emitting layer, a green light-emitting layer, and a red light-emitting layer, wherein the blue light-emitting layer is disposed in the first opening, the green light-emitting layer is disposed in the second opening, and the red light-emitting layer is disposed in the third opening; and a thickness of the first sub-anode, a thickness of the second sub-anode, and a thickness of the third sub-anode increase sequentially.

7. The display panel according to claim 6, wherein the anodes comprise first anode subparts and one or more second anode subparts, the first sub-anode is composed of one of the first anode subparts, the second sub-anode is composed of one of the first anode subparts, and the third sub-anode is composed of one of the first anode subparts and one of the second anode subparts; and a thickness of each of the first anode subparts corresponding to the first sub-anode is less than a thickness of each of the first anode subparts corresponding to the second sub-anode.

8. The display panel according to claim 6, wherein the anodes comprise first anode subparts, each of the first sub-anode, the second sub-anode, and the third sub-anode is composed of one of the first anode subparts; and a thickness of each of the first anode subparts corresponding to the first sub-anode, a thickness of each of the first anode subparts corresponding to the second sub-anode, and a thickness of each of the first anode subparts corresponding to the third sub-anode increase sequentially.

9. The display panel according to claim 1, wherein the pixel definition layer further comprises pixel definition parts each surrounding one of the pixel definition openings, and a width of an orthographic projection of each of the pixel definition parts on the substrate is less than or equal to 2.5 microns; and a distance between orthographic projections of adjacent ones of the anodes on the substrate is greater than or equal to 1 micron.

10. The display panel according to claim 1, wherein the first pixel definition sublayer further comprises a fifth inorganic sublayer disposed on a side of the first inorganic sublayer adjacent to the substrate; the first opening comprises a fifth sub-opening penetrating through the fifth inorganic sublayer; and an orthographic projection of the fifth sub-opening on the substrate is located within the orthographic projection of the first sub-opening on the substrate.

11. The display panel according to claim 1, wherein the second pixel definition sublayer comprises a third inorganic sublayer and a fourth inorganic sublayer disposed on a side of the third inorganic sublayer away from the substrate; each of the pixel definition openings comprises a third sub-opening penetrating through the third inorganic sublayer and a fourth sub-opening penetrating through the fourth inorganic sublayer; and an orthographic projection of the fourth sub-opening on the substrate is located within an ortho-graphic projection of the third sub-opening on the substrate.

12. The display panel according to claim 11, wherein the second pixel definition sublayer further comprises a sixth inorganic sublayer disposed on a side of the third inorganic sublayer adjacent to the substrate; each of the pixel defini-tion openings comprises a sixth sub-opening penetrating through the sixth inorganic sublayer; and an orthographic projection of the sixth sub-opening on the substrate is located within the orthographic projection of the third sub-opening on the substrate.

13. The display panel according to claim 10, wherein a material of the first inorganic sublayer is selected from silicon nitride compounds; and materials of the second inorganic sublayer and the fifth inorganic sublayer are selected from silicon oxide compounds.

14. The display panel according to claim 12, wherein a material of the third inorganic sublayer is selected from silicon nitride compounds; and materials of the fourth inorganic sublayer and the sixth inorganic sublayer are selected from silicon oxide compounds.

15. The display panel according to claim 1, wherein the pixel definition layer further comprises fourth openings each disposed between adjacent ones of the pixel definition openings, and each of the fourth openings penetrates at least part of the pixel definition layer.

16. The display panel according to claim 1, further comprising a barrier layer disposed on the pixel definition layer, wherein the barrier layer comprises fifth openings each corresponding to one of the pixel definition opening.

17. A display panel, comprising:

a substrate;

anodes, disposed on the substrate and comprising at least one first sub-anode and at least one second sub-anode adjacent to the first sub-anode; and a pixel definition layer disposed on a side of the first sub-anode away from the substrate, wherein a difference between a first distance between a side of the first sub-anode away from the substrate and the substrate and a second distance between a side of the second sub-anode away from the substrate and the substrate is greater than or equal to a thickness of the second sub-anode;

wherein at least a part of the pixel definition layer is disposed on a side of the second sub-anode adjacent to the substrate;

wherein the pixel definition layer comprises a first pixel definition sublayer disposed on the side of the second sub-anode adjacent to the substrate and a second pixel definition sublayer disposed on a side of the first pixel definition sublayer away from the substrate;

wherein the pixel definition layer further comprises pixel definition openings, and the pixel definition openings comprise a first opening corresponding to the first sub-anode and a second opening corresponding to the second sub-anode;

the first opening exposes at least a part of the first sub-anode, and the second opening exposes at least a part of the second sub-anode; and a depth of the first opening is greater than a depth of the second opening;

wherein the first opening penetrates through the first pixel definition sublayer and the second pixel definition sublayer, and the second opening penetrates through the second pixel definition sublayer;

wherein the anodes further comprise at least one third sub-anode disposed adjacent to the first sub-anode, or adjacent to the first sub-anode and the second sub-anode, or adjacent to the second sub-anode, the pixel definition openings further comprise a third opening corresponding to the third sub-anode, the third opening exposes at least a part of the third sub-anode, and a depth of the third opening is less than or equal to the depth of the first opening; and wherein the second opening only penetrates through the second pixel definition sublayer, and the third opening only penetrates through the second pixel definition sublayer.

18. The display panel according to claim 17, wherein the pixel definition layer further comprises pixel definition parts each surrounding one of the pixel definition openings, and a width of an orthographic projection of each of the pixel definition parts on the substrate is less than or equal to 2.5 microns; and a distance between orthographic projections of adjacent ones of the anodes on the substrate is greater than or equal to 1 micron.

19. A display panel, comprising:

a substrate;

anodes, disposed on the substrate and comprising at least one first sub-anode and at least one second sub-anode adjacent to the first sub-anode; and a pixel definition layer disposed on a side of the first sub-anode away from the substrate, wherein a difference between a first distance between a side of the first sub-anode away from the substrate and the substrate and a second distance between a side of the second sub-anode away from the substrate and the substrate is greater than or equal to a thickness of the second sub-anode;

wherein at least a part of the pixel definition layer is disposed on a side of the second sub-anode adjacent to the substrate;

wherein the pixel definition layer comprises a first pixel definition sublayer disposed on the side of the second sub-anode adjacent to the substrate and a second pixel definition sublayer disposed on a side of the first pixel definition sublayer away from the substrate;

wherein the pixel definition layer further comprises pixel definition openings, and the pixel definition openings comprise a first opening corresponding to the first sub-anode and a second opening corresponding to the second sub-anode;

the first opening exposes at least a part of the first sub-anode, and the second opening exposes at least a part of the second sub-anode; and a depth of the first opening is greater than a depth of the second opening;

wherein the first opening penetrates through the first pixel definition sublayer and the second pixel definition sublayer, and the second opening penetrates through the second pixel definition sublayer;

wherein the anodes further comprise at least one third sub-anode disposed adjacent to the first sub-anode, or adjacent to the first sub-anode and the second sub-anode, or adjacent to the second sub-anode, the pixel definition openings further comprise a third opening corresponding to the third sub-anode, the third opening exposes at least a part of the third sub-anode, and a depth of the third opening is less than or equal to the depth of the first opening; and wherein the display panel further comprises a blue light-emitting layer, a green light-emitting layer, and a red light-emitting layer, the blue light-emitting layer is disposed in the first opening, the green light-emitting layer is disposed in the second opening, and the red light-emitting layer is disposed in the third opening; and a thickness of the first sub-anode, a thickness of the second sub-anode, and a thickness of the third sub-anode increase sequentially.

20. The display panel according to claim 19, wherein the pixel definition layer further comprises pixel definition parts each surrounding one of the pixel definition openings, and a width of an orthographic projection of each of the pixel definition parts on the substrate is less than or equal to 2.5 microns; and a distance between orthographic projections of adjacent ones of the anodes on the substrate is greater than or equal to 1 micron.

\* \* \* \* \*